US012701710B2

(12) United States Patent
Lee et al.

(10) Patent No.: US 12,701,710 B2
(45) Date of Patent: Aug. 4, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Jaeduk Lee, Seongnam-si (KR); Joonam Kim, Hwaseong-si (KR); Sejun Park, Yongin-si (KR); Raeyoung Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 896 days.

(21) Appl. No.: 17/867,962

(22) Filed: Jul. 19, 2022

(65) Prior Publication Data
US 2023/0023911 A1 Jan. 26, 2023

(30) Foreign Application Priority Data
Jul. 20, 2021 (KR) ......................... 10-2021-0095154

(51) Int. Cl.
*H10B 43/35* (2023.01)
*H10B 41/27* (2023.01)
(Continued)

(52) U.S. Cl.
CPC ............. *H10B 43/35* (2023.02); *H10B 41/27* (2023.02); *H10B 41/35* (2023.02); *H10B 41/41* (2023.02); *H10B 43/27* (2023.02); *H10B 43/40* (2023.02)

(58) Field of Classification Search
CPC ........ H10B 43/35; H10B 41/27; H10B 41/35; H10B 41/41; H10B 43/27; H10B 43/40; H10B 41/20; H10B 43/20; G11C 16/08; G11C 16/26; G11C 16/0483; H01L 25/0657
See application file for complete search history.

(56) References Cited

U.S. PATENT DOCUMENTS 9,236,340 B2 1/2016 Lee et al.
9,899,401 B2 2/2018 Seol et al.
(Continued)

FOREIGN PATENT DOCUMENTS

KR 10-2020-0020187 A 2/2020
KR 10-2020-0113063 A 10/2020

*Primary Examiner* — Sue A Purvis
*Assistant Examiner* — Carnell Hunter, III
(74) *Attorney, Agent, or Firm* — Wolf, Greenfield & Sacks, P.C.

(57) ABSTRACT

Semiconductor devices are provided. The semiconductor devices may include a peripheral circuit structure, a memory cell block arranged on the peripheral circuit structure and including strings, each of which includes a lower select transistor, memory cell transistors, and an upper select transistor connected in series and stacked in a vertical direction, and bit lines on the memory cell block. The bit lines may include a first bit line electrically connected to first to third strings of the strings. The lower select transistors of the first to third strings include first to third lower select gate electrodes, respectively. The second lower select gate electrode may be arranged at a different vertical level from the first lower select gate electrode, and the third lower select gate electrode may be arranged at the same vertical level as the first lower select gate electrode.

20 Claims, 37 Drawing Sheets

(51) Int. Cl.

| | | |
|---|---|---|
| *H10B 41/35* | (2023.01) | |
| *H10B 41/41* | (2023.01) | |
| *H10B 43/27* | (2023.01) | |
| *H10B 43/40* | (2023.01) | |

(56) References Cited

U.S. PATENT DOCUMENTS

| | | | |
|---|---|---|---|
| 10,396,093 B2 | 8/2019 | Song et al. | |
| 10,510,771 B2 | 12/2019 | Nam et al. | |
| 10,522,563 B2 | 12/2019 | Lee | |
| 10,706,930 B2 | 7/2020 | Yip | |
| 10,902,919 B2 | 1/2021 | Shibata et al. | |
| 11,264,401 B2 | 3/2022 | Kim et al. | |
| 2012/0068255 A1* | 3/2012 | Lee | H10B 43/27 |
| | | | 257/324 |
| 2019/0122734 A1* | 4/2019 | Shibata | G11C 16/26 |
| 2020/0058671 A1* | 2/2020 | Kim | H10B 43/10 |
| 2020/0303410 A1 | 9/2020 | Kanamori et al. | |

* cited by examiner

|  | MS11 / MS21 | MS12 / MS22 | MS13 / MS23 |
|---|---|---|---|
| SSL_C | GND | GND | GND |
| SSL1 | Vpgm | Vpgm | Vpgm |
| SSL2 | Vpass | Vpass | Vpass |
| SSL3 | Vpass | Vpass | Vpass |
| WL | Vpass | Vpass | Vpass |
| GSL1 | GND |  |  |
| GSL2 |  | Vpass |  |
| GSL3 |  |  | Vpass |
| GSL_C | Vpass | Vpass | Vpass |
| CSL | GND | GND | GND |

| | MS11 / MS21 | MS12 / MS22 | MS13 / MS23 |
|---|---|---|---|
| SSL_C | GND | GND | GND |
| SSL1 | Vpass | Vpass | Vpass |
| SSL2 | Vpass | Vpass | Vpass |
| SSL3 | Vpgm | Vpgm | Vpgm |
| WL | Vpass | Vpass | Vpass |
| GSL1 | Vpass | | |
| GSL2 | | Vpass | |
| GSL3 | | | GND |
| GSL_C | Vpass | Vpass | Vpass |
| CSL | GND | GND | GND |

| | MS11 / MS21 | MS12 / MS22 | MS13 / MS23 |
|---|---|---|---|
| SSL_C | Vcc | Vcc | Vcc |
| SSL1 | GND | GND | GND |
| SSL2 | Vread | Vread | Vread |
| SSL3 | Vread | Vread | Vread |
| WL | Vr | Vr | Vr |
| GSL1 | Vread | | |
| GSL2 | | Vread | |
| GSL3 | | | Vread |
| GSL_C | Vread | Vread | Vread |
| CSL | GND | GND | GND |

| | MS11 / MS21 | MS12 / MS22 | MS13 / MS23 |
|---|---|---|---|
| SSL_C | Vcc | Vcc | Vcc |
| SSL1 | GND | GND | GND |
| SSL2 | Vpass | Vpass | Vpass |
| SSL3 | Vpass | Vpass | Vpass |
| WL | Vpgm | Vpgm | Vpgm |
| GSL1 | Vpass | | |
| GSL2 | | Vpass | |
| GSL3 | | | Vpass |
| GSL_C | Vpass | Vpass | Vpass |
| CSL | GND | GND | GND |

FIG. 30

SEMICONDUCTOR DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2021-0095154, filed on Jul. 20, 2021, in the Korean Intellectual Property Office, the disclosure of which is incorporated by reference herein in its entirety.

BACKGROUND

The inventive concept relates to a semiconductor device and an electronic system including the same, and more particularly, to a semiconductor device having a vertical channel and an electronic system including the same.

In an electronic system requiring data storage, a semiconductor device capable of storing high-capacity data may be beneficial. Accordingly, a method of increasing the data storage capacity of a semiconductor device is being studied. For example, as one of the methods of increasing the data storage capacity of a semiconductor device, a semiconductor device including memory cells arranged three-dimensionally instead of memory cells arranged two-dimensionally has been proposed.

SUMMARY

The inventive concept provides a semiconductor device capable of reducing/preventing defects in a channel hole-forming process.

The inventive concept also provides an electronic system including the semiconductor device.

According to some embodiments of the inventive concept, there is provided a semiconductor device including: a peripheral circuit structure; a memory cell block arranged on the peripheral circuit structure and including a plurality of strings, each string including a lower select transistor, memory cell transistors, and an upper select transistor, and the lower select transistor, the memory cell transistors and the upper select transistor being connected in series and stacked in a vertical direction; and bit lines on the memory cell block, the bit lines including a first bit line electrically connected to a first string, a second string, and a third string among the plurality of strings, wherein the lower select transistor of the first string includes a first lower select gate electrode, wherein the lower select transistor of the second string includes a second lower select gate electrode arranged at a different vertical level from the first lower select gate electrode and electrically separated (e.g., electrically isolated) from the first lower select gate electrode, and wherein the lower select transistor of the third string includes a third lower select gate electrode arranged at the same vertical level as the first lower select gate electrode and electrically separated (e.g., electrically isolated) from the first and second lower select gate electrodes. In some embodiments, a lower surface of the second lower select gate electrode may be at a different vertical level from a lower surface of the first lower select gate electrode, and a lower surface of the third lower select gate electrode may be at the same vertical level as the lower surface of the first lower select gate electrode.

According to some embodiments of the inventive concept, there is provided a semiconductor device including: a peripheral circuit structure; a plurality of gate electrodes spaced apart from each other in a vertical direction on the peripheral circuit structure; first and second stack separation insulating layers arranged on opposing sides of the plurality of gate electrodes, respectively, and extending in a first horizontal direction; a plurality of channel structures extending in the vertical direction through the plurality of gate electrodes; and bit lines electrically connected to the plurality of channel structures on the plurality of gate electrodes, wherein the plurality of channel structures include a first channel structure, a second channel structure, and a third channel structure connected to (e.g., electrically connected to) a first bit line among the bit lines, and wherein the plurality of gate electrodes include: a first lower select gate electrode surrounding a first lower portion of a sidewall of the first channel structure; a second lower select gate electrode surrounding a first lower portion of a sidewall of the second channel structure and arranged at a vertical level higher than the first lower select gate electrode; a third lower select gate electrode surrounding a first lower portion of a sidewall of the third channel structure and arranged at the same vertical level as the first lower select gate electrode; a plurality of word lines arranged on the first to third lower select gate electrodes, each word line surrounding sidewalls of the first to third channel structures; and upper select gate electrodes surrounding middle portions of the sidewalls of the first to third channel structures on the plurality of word lines. In some embodiments, a lower surface of the second lower select gate electrode may be at a vertical level higher than a lower surface of the first lower select gate electrode, and a lower surface of the third lower select gate electrode may be at the same vertical level as the lower surface of the first lower select gate electrode.

According to some embodiments of the inventive concept, there is provided an electronic system including: a main board; a semiconductor device on the main board; and a controller electrically connected to the semiconductor device on the main board, wherein the semiconductor device includes: a peripheral circuit structure; a memory cell block arranged on the peripheral circuit structure and including a plurality of strings, each string including a lower select transistor, memory cell transistors, and an upper select transistor, and the lower select transistor, the memory cell transistors and the upper select transistor being connected in series and stacked in a vertical direction; and bit lines on the memory cell block, the bit lines including a first bit line electrically connected to a first string, a second string, and a third string among the plurality of strings, wherein the lower select transistor of the first string includes a first lower select gate electrode, wherein the lower select transistor of the second string includes a second lower select gate electrode arranged at a different vertical level from the first lower select gate electrode and electrically separated (e.g., electrically isolated) from the first lower select gate electrode, and wherein the lower select transistor of the third string includes a third lower select gate electrode arranged at the same vertical level as the first lower select gate electrode and electrically separated (e.g., electrically isolated) from the first and second lower select gate electrodes. In some embodiments, a lower surface of the second lower select gate electrode may be at a different vertical level from a lower surface of the first lower select gate electrode, and a lower surface of the third lower select gate electrode may be at the same vertical level as the lower surface of the first lower select gate electrode.

BRIEF DESCRIPTION OF THE DRAWINGS

Embodiments of the inventive concept will be more clearly understood from the following detailed description taken in conjunction with the accompanying drawings in which:

FIG. 30 is a perspective view schematically illustrating a data storage system including a semiconductor device according to example embodiments;

DETAILED DESCRIPTION

Hereinafter, example embodiments of the technical idea of the inventive concept will be described in detail with reference to the accompanying drawings.

Figure 1:
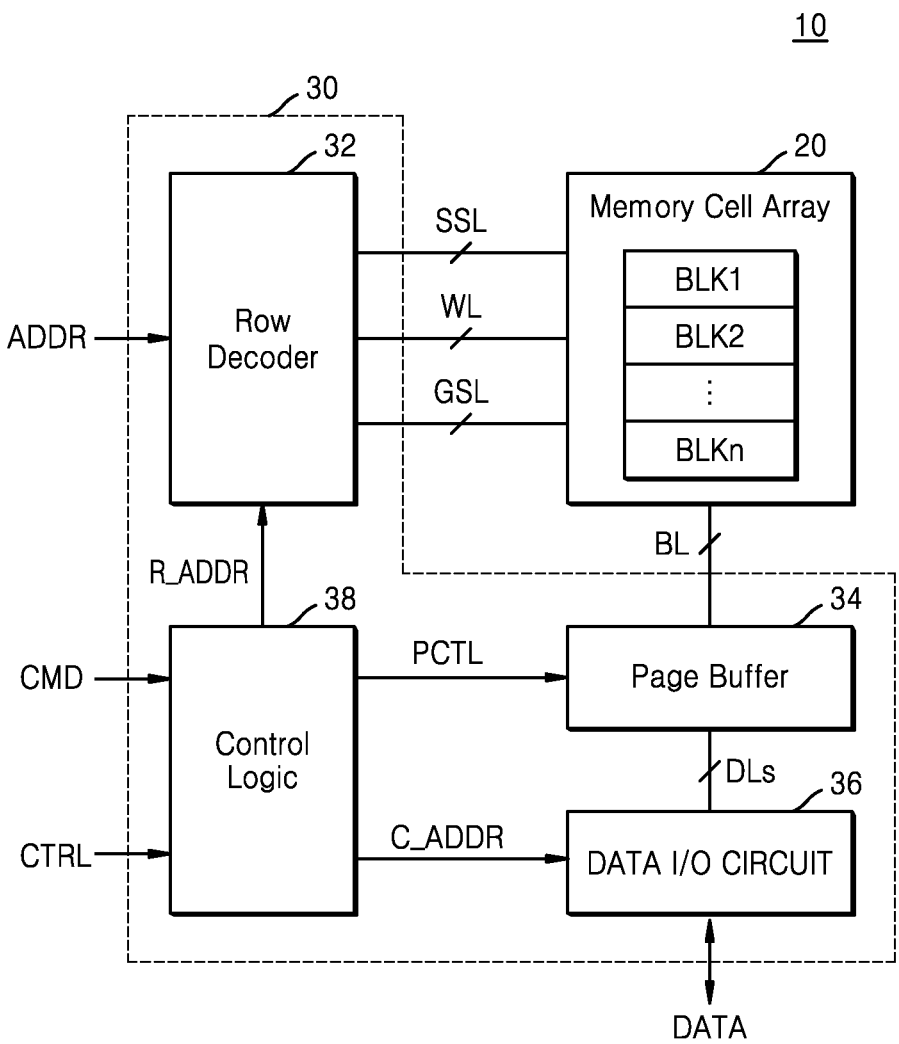
FIG. 1 is a block diagram of a semiconductor device according to example embodiments.

FIG. 1 is a block diagram of a semiconductor device 10 according to example embodiments.

Referring to FIG. 1, the semiconductor device 10 may include a memory cell array 20 and a peripheral circuit 30. The memory cell array 20 includes a plurality of memory cell blocks BLK1, BLK2, . . . , BLKn. Each of the plurality of memory cell blocks BLK1, BLK2, . . . , BLKn may include a plurality of memory cells. The memory cell blocks BLK1, BLK2, . . . , BLKn may be connected to the peripheral circuit 30 through a bit line BL, a word line WL, a string select line SSL, and a ground select line GSL.

The peripheral circuit 30 may include a row decoder 32, a page buffer 34, a data input/output (I/O) circuit 36, and a control logic 38. Although not shown in FIG. 1, the peripheral circuit 30 may further include an I/O interface, column logic, a voltage generator, a pre-decoder, a temperature sensor, a command decoder, an address decoder, an amplifier circuit, and the like.

The memory cell array 20 may be connected to the page buffer 34 through the bit line BL, and may be connected to the row decoder 32 through the word line WL, the string select line SSL, and the ground select line GSL. In the memory cell array 20, each of the plurality of memory cells included in the plurality of memory cell blocks BLK1, BLK2, . . . , BLKn may be a flash memory cell. The memory cell array 20 may include a three-dimensional memory cell array. The three-dimensional memory cell array may include a plurality of NAND strings, and each NAND string may include a plurality of memory cells connected to a plurality of word lines WL stacked vertically on a substrate.

The peripheral circuit 30 may receive an address ADDR, a command CMD, and a control signal CTRL from the outside of the semiconductor device 10, and may transmit/receive data DATA to and from an external device of the semiconductor device 10.

The row decoder 32 may select at least one of the plurality of memory cell blocks BLK1, BLK2, . . . , BLKn in response to an address ADDR from the outside, and may select a word line WL, a string select line SSL, and a ground select line GSL of the selected memory cell block. The row decoder 32 may transmit a voltage for performing a memory operation to the word line WL of the selected memory cell block.

The page buffer 34 may be connected to the memory cell array 20 through the bit line BL. The page buffer 34 may operate as a write driver during a program operation to apply a voltage according to the data DATA to be stored in the memory cell array 20 to the bit line BL, and may operate as a sense amplifier during a read operation to sense data DATA stored in the memory cell array 20. The page buffer 34 may operate according to a control signal PCTL provided from the control logic 38.

The data I/O circuit 36 may be connected to the page buffer 34 through data lines DLs. The data I/O circuit 36 may receive data DATA from a memory controller (not shown) during a program operation, and may provide the program data DATA to the page buffer 34 based on the column address C_ADDR provided from the control logic 38. The data I/O circuit 36 may provide the read data DATA stored in the page buffer 34 to the memory controller based on the column address C_ADDR provided from the control logic 38 during a read operation.

The data I/O circuit 36 may transmit an input address or command to the control logic 38 or the row decoder 32. The peripheral circuit 30 may further include an Electro Static Discharge (ESD) circuit and a pull-up/pull-down driver.

The control logic 38 may receive a command CMD and a control signal CTRL from the memory controller. The control logic 38 may provide the row address R_ADDR to the row decoder 32 and provide the column address C_ADDR to the data I/O circuit 36. The control logic 38 may generate various internal control signals used in the semiconductor device 10 in response to the control signal CTRL. For example, the control logic 38 may adjust the voltage level provided to the word line WL and the bit line BL when a memory operation such as a program operation or an erase operation is performed.

Figure 2:
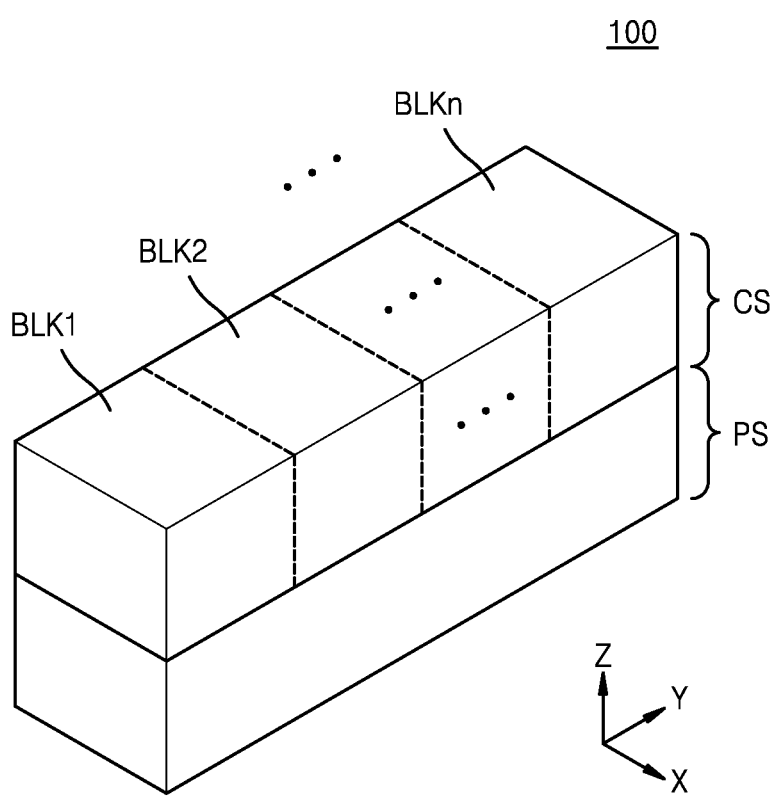
FIG. 2 is a perspective view of a semiconductor device according to example embodiments.
Figure 3:
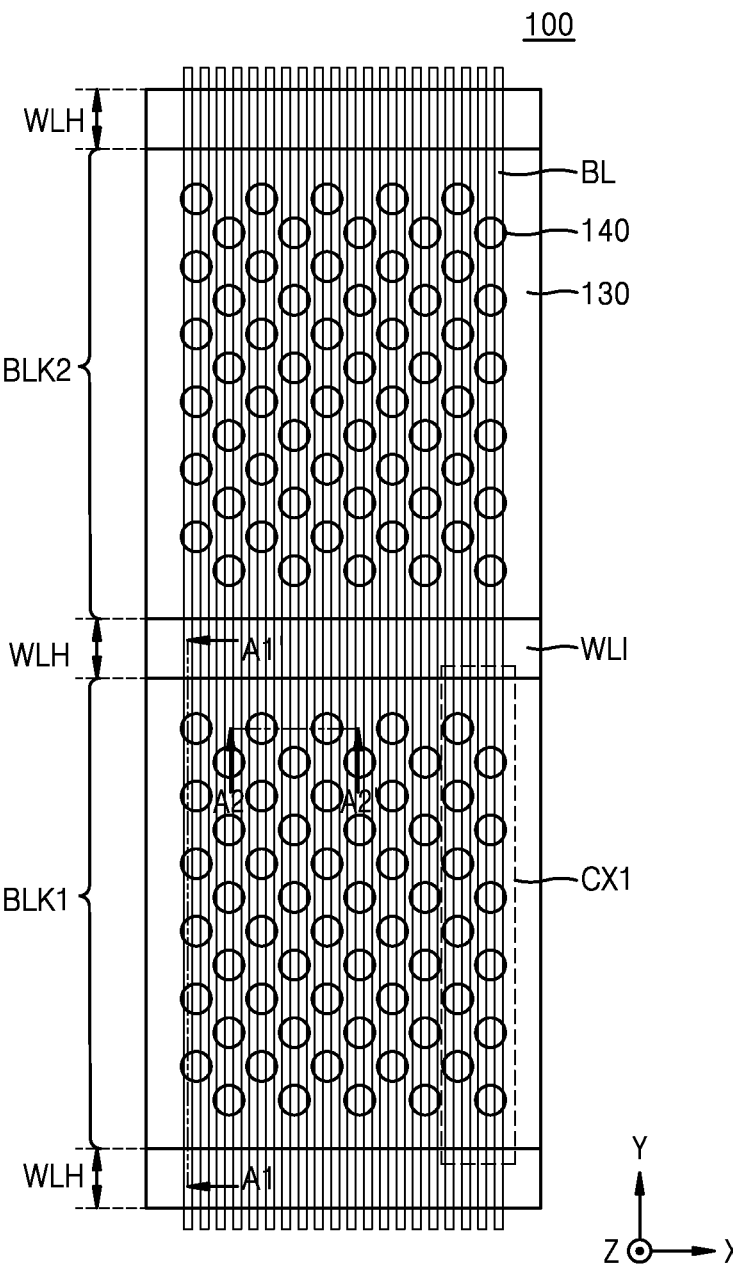
FIG. 3 is a plan view of the semiconductor device of FIG. 2 according to example embodiments.
Figure 4:
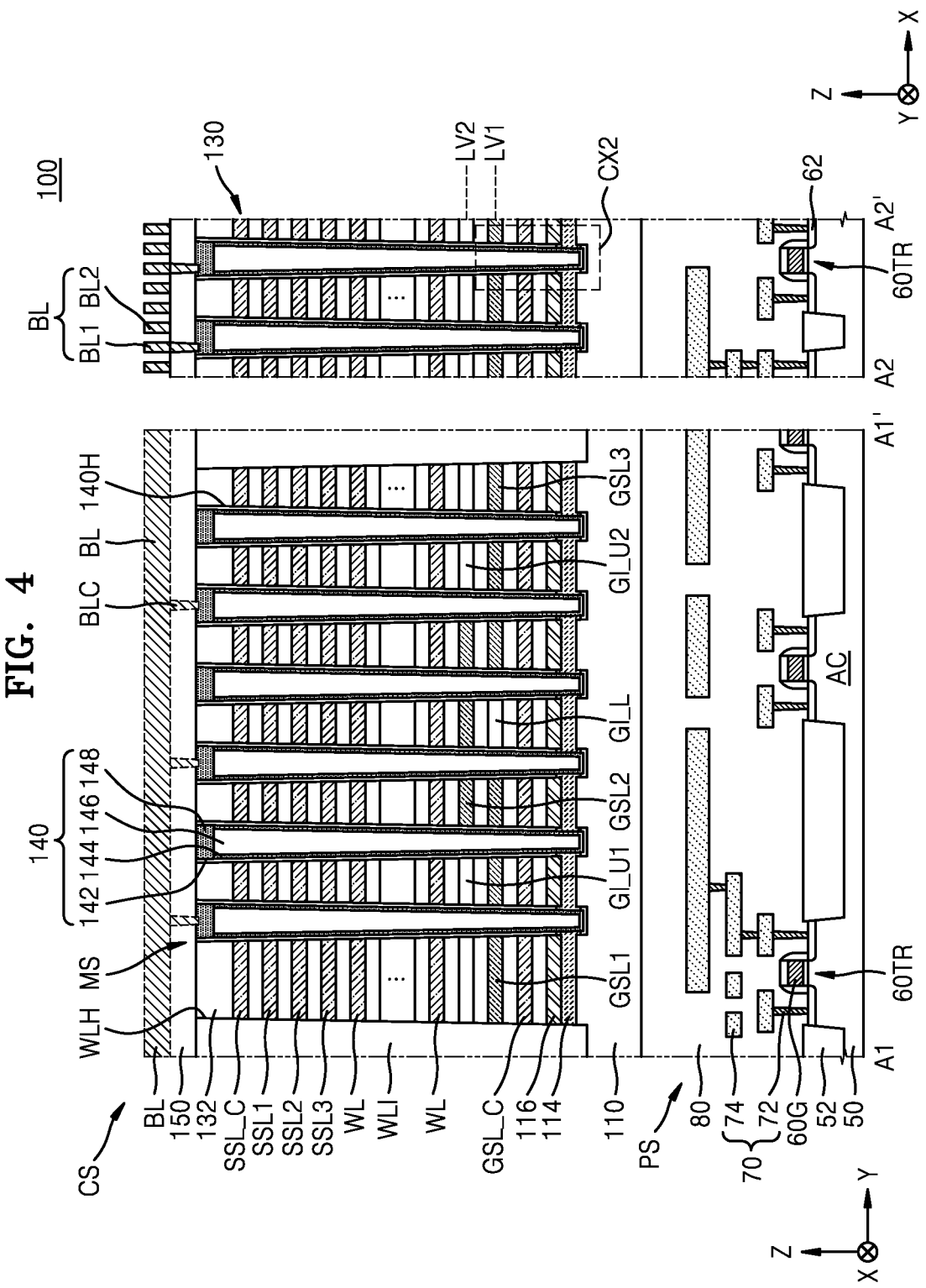
FIG. 4 is a cross-sectional view taken along lines A1-A1' and A2-A2' of FIG. 3 according to example embodiments.
Figure 5:
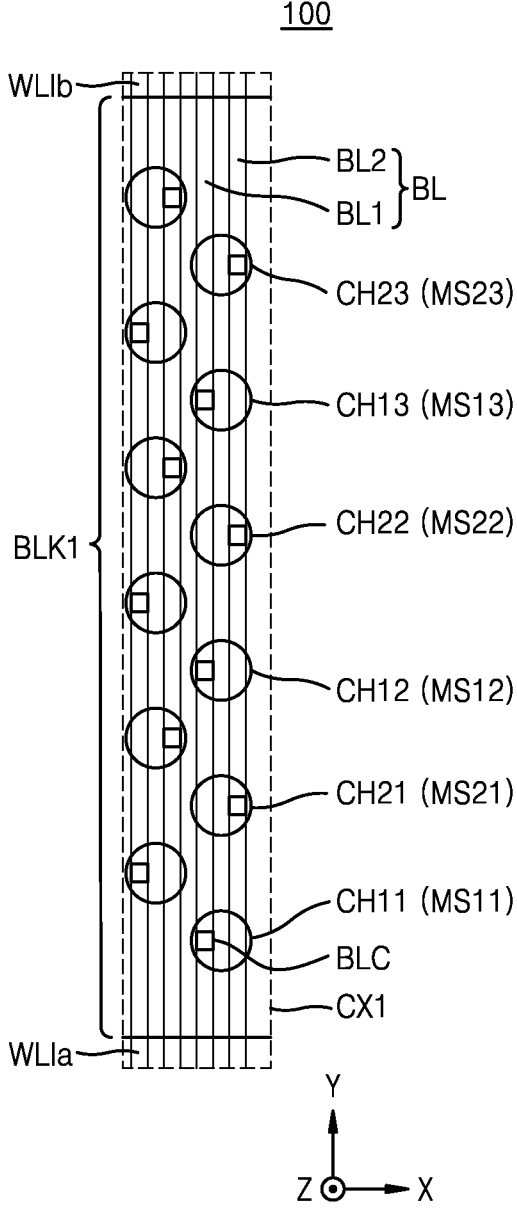
FIG. 5 is an enlarged view of a region CX1 of FIG. 3 according to example embodiments.
Figure 6:
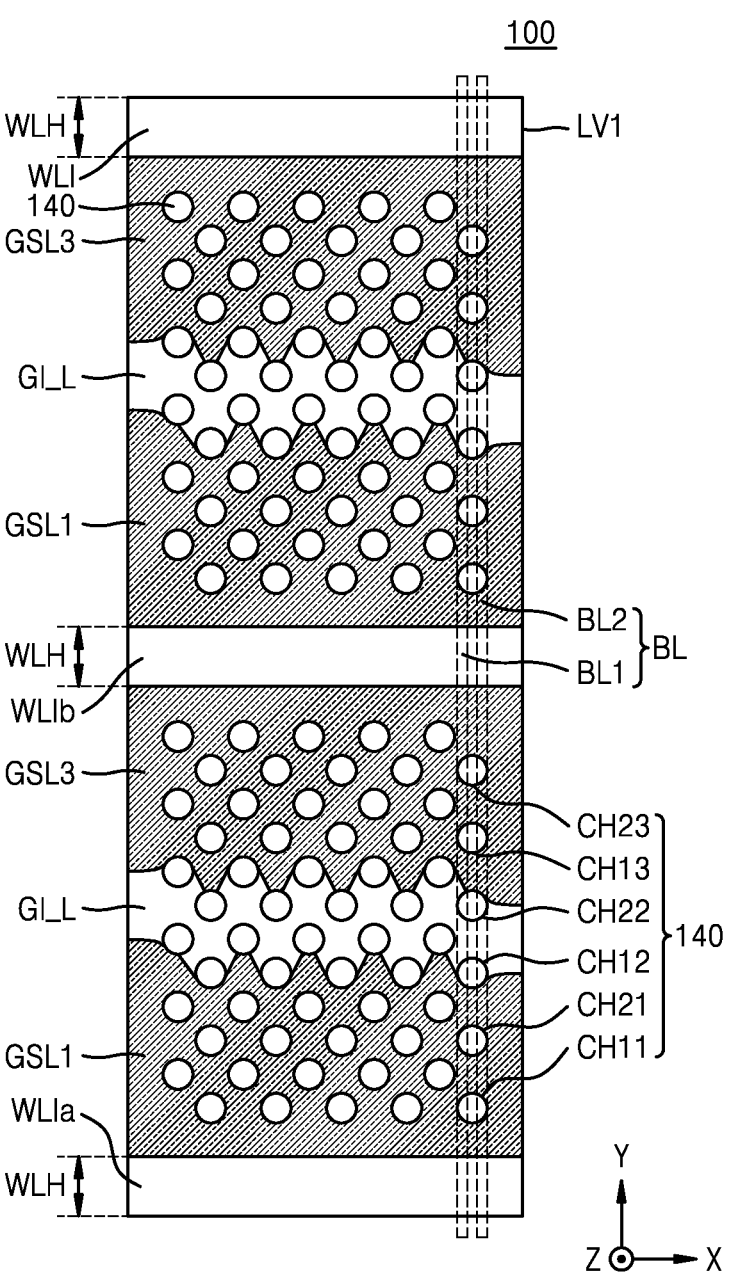
FIG. 6 is a horizontal cross-sectional view at a first vertical level LV1 of FIG. 4 according to example embodiments.
Figure 7:
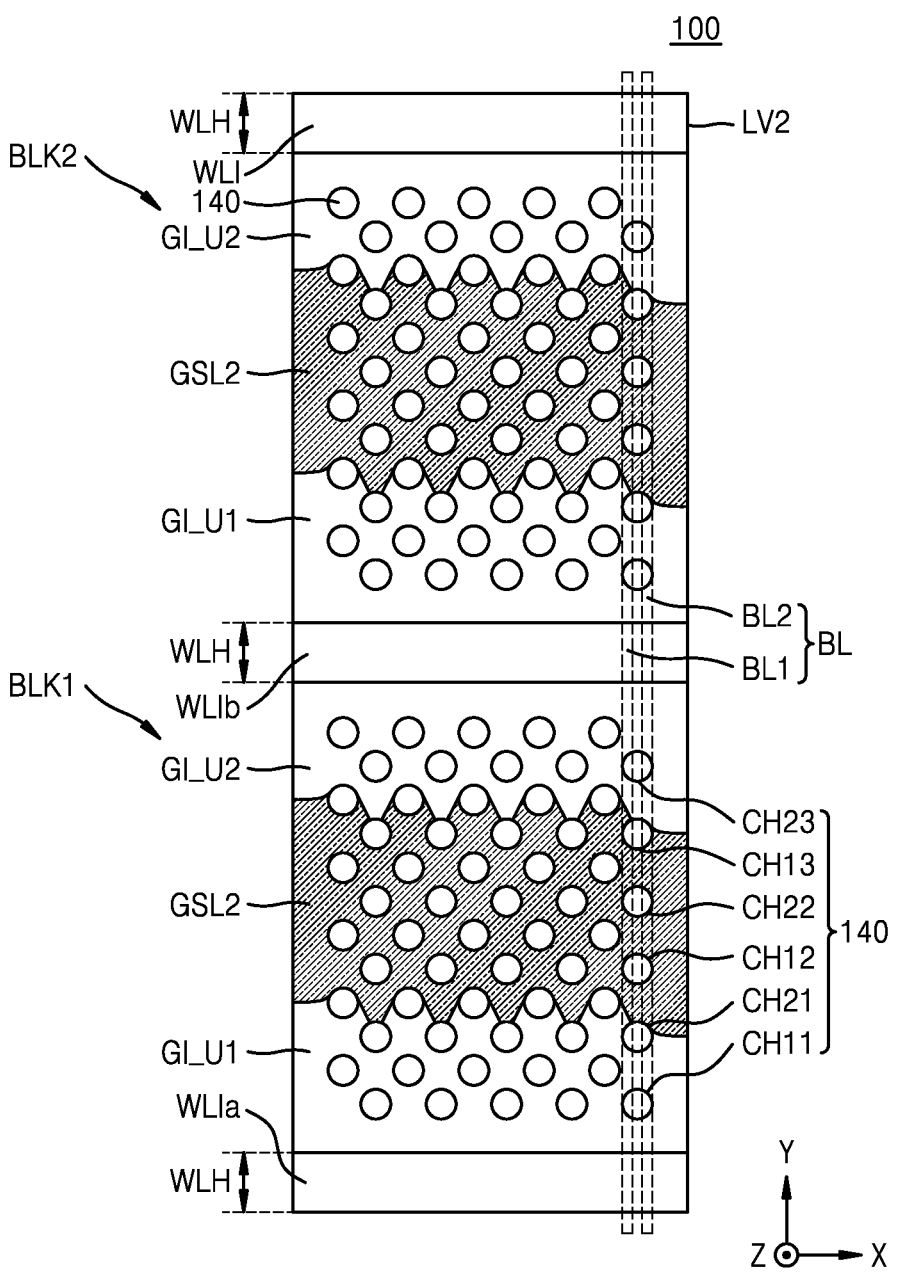
FIG. 7 is a horizontal cross-sectional view at a second vertical level LV2 of FIG. 4 according to example embodiments.
Figure 8:
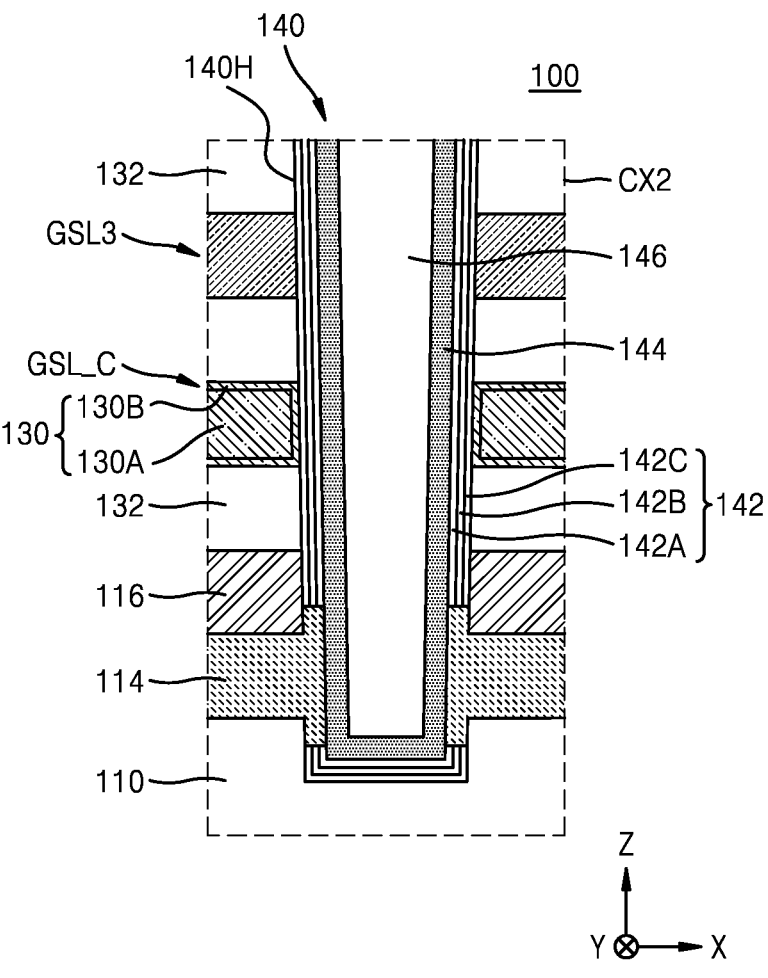
FIG. 8 is an enlarged view of a region CX2 of FIG. 4.
Figure 9:
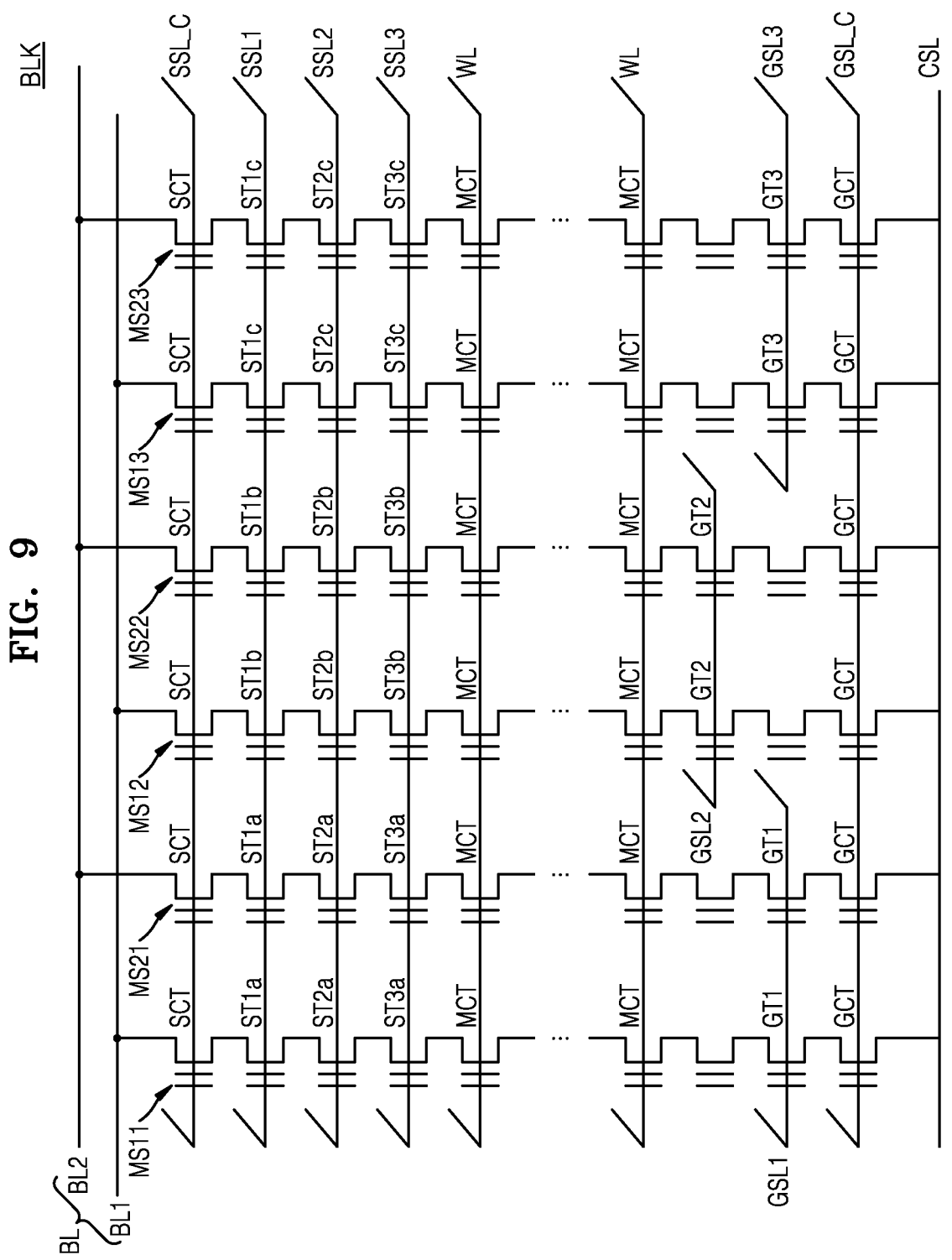
FIG. 9 is an equivalent circuit diagram illustrating each block of the semiconductor device.

FIGS. 2 to 9 are diagrams for explaining the semiconductor device 100 according to example embodiments. Specifically, FIG. 2 is a perspective view illustrating a configuration of the semiconductor device 100 according to example embodiments, and FIG. 3 is a plan view illustrating the semiconductor device 100 of FIG. 3. FIG. 4 is a cross-sectional view taken along lines A1-A1' and A2-A2' of FIG. 3, and FIG. 5 is an enlarged view of a region CX1 of FIG. 3. FIG. 6 is a horizontal cross-sectional view at the first vertical level LV1 of FIG. 4, and FIG. 7 is a horizontal cross-sectional view at the second vertical level LV2 of FIG. 4. FIG. 8 is an enlarged view of a region CX2 of FIG. 4. FIG. 9 is an equivalent circuit diagram illustrating each block BLK of the semiconductor device 100.

Referring to FIGS. 2 to 9, the semiconductor device 100 includes a cell array structure CS and a peripheral circuit structure PS overlapping each other in the vertical direction Z. The cell array structure CS may include the memory cell array 20 described with reference to FIG. 1, and the peripheral circuit structure PS may include the peripheral circuit 30 described with reference to FIG. 1.

In FIGS. 2 to 9, a cell over periphery (COP) structure in which the cell array structure CS is arranged on the peripheral circuit structure PS is illustrated by way of example. However, the technical idea of the inventive concept is not limited thereto. In other embodiments, the semiconductor device 100 may have a chip to chip (C2C) structure instead of the COP structure. The C2C structure may include an upper chip including the cell array structure CS, which is manufactured on a first wafer, and a lower chip including the peripheral circuit structure PS, which is manufactured on a second wafer different from the first wafer. The upper chip and the lower chip are connected to each other by a bonding method. For example, the bonding method may refer to a method of electrically connecting the bonding metal formed in the uppermost metal layer of the upper chip and the bonding metal formed in the uppermost metal layer of the lower chip to each other. For example, when the bonding metal is formed of copper (Cu), the bonding method may be a Cu-to-Cu bonding method, and alternatively, the bonding metal may be formed of aluminum (Al) or tungsten (W).

The memory cell array 20 includes a plurality of memory cell blocks BLK1, BLK2, . . . , BLKn. Each of the plurality of memory cell blocks BLK1, BLK2, . . . , BLKn may include three-dimensionally arranged memory cells.

The peripheral circuit structure PS may include a peripheral circuit transistor 60TR and a peripheral circuit wiring structure 70 arranged on a substrate 50. In the substrate 50, an active region AC may be defined by a device separation film 52, and a plurality of peripheral circuit transistors 60TR may be formed on the active region AC. The plurality of peripheral circuit transistors 60TR may include a peripheral circuit gate 60G and a source/drain region 62 arranged in a portion of the substrate 50 on one of opposing sides of the peripheral circuit gate 60G.

The substrate 50 may include a semiconductor material, for example, a group IV semiconductor, a group Ill-V compound semiconductor, or a group II-VI oxide semiconductor. For example, the group IV semiconductor may include silicon (Si), germanium (Ge), or silicon-germanium. The substrate 50 may be provided as a bulk wafer or as an epitaxial layer. In another embodiment, the substrate 50 may include a silicon-on-insulator (SOI) substrate or a germanium-on-insulator (GeOI) substrate.

The peripheral circuit wiring structure 70 includes a plurality of peripheral circuit contacts 72 and a plurality of peripheral circuit wiring layers 74. An interlayer insulating film 80 covering the peripheral circuit transistor 60TR and the peripheral circuit wiring structure 70 may be arranged on the substrate 50. The plurality of peripheral circuit wiring layers 74 may have a multilayer structure including a plurality of metal layers arranged at different vertical levels.

A common source plate 110 may be arranged on the interlayer insulating film 80. In example embodiments, the common source plate 110 may function as a source region supplying current to vertical memory cells formed in the cell array structure CS. The common source plate 110 may be arranged on the memory cell region MCR, the connection region CON, and the peripheral circuit connection region PRC of the substrate 50.

In example embodiments, the common source plate 110 may include at least one of silicon (Si), germanium (Ge), silicon germanium (SiGe), gallium arsenide (GaAs), indium gallium arsenide (InGaAs), aluminum gallium arsenide (AlGaAs), and mixtures thereof. Also, the common source plate 110 may include a semiconductor doped with an n-type impurity. Also, the common source plate 110 may have a crystal structure including at least one selected from single crystal, amorphous, and polycrystalline. In some examples, the common source plate 110 may include polysilicon doped with n-type impurities.

A horizontal semiconductor layer 114 and a support layer 116 may be sequentially stacked on an upper surface of the common source plate 110. In example embodiments, the horizontal semiconductor layer 114 may include doped polysilicon or undoped polysilicon. The horizontal semiconductor layer 114 may function as a part of a common source region connecting the common source plate 110 and the channel layer 144 to each other. For example, the support layer 116 may include doped or undoped polysilicon. The support layer 116 may serve as a support layer for reducing or preventing collapsing of the mold stack or collapsing of elements in a process of removing a sacrificial material layer (not shown) for forming the horizontal semiconductor layer 114. As used herein, a lower surface of an element refers to a surface facing the substrate 50, and "a surface A is lower than a surface B" (or similar language) means that the surface A is closer than the surface B to the substrate 50.

A plurality of gate electrodes 130 and a plurality of mold insulating layers 132 may be alternately arranged on the common source plate 110 in the vertical direction Z. For example, a first mold insulating layer 132 of the plurality of mold insulating layers 132 may be arranged between the common source plate 110 and the lowermost gate electrode 130, a second mold insulating layer 132 of the plurality of mold insulating layers 132 may be arranged between two adjacent gate electrodes 130, and a third mold insulating layer 132 among the plurality of mold insulating layers 132 may be arranged on the uppermost gate electrode 130.

In some embodiments, as shown in FIG. 3, a plurality of gate stack separation openings WLH may extend in the first horizontal direction X parallel to the upper surface of the common source plate 110 on the common source plate 110. A plurality of gate electrodes 130 arranged between two adjacent gate stack separation openings WLH may constitute one memory cell block BLK. For example, a first memory cell block BLK1 and a second memory cell block BLK2 are illustrated in FIG. 3.

A plurality of stack separation insulating layers WLI may be arranged on the common source plate 110 to fill the inside of the plurality of gate stack separation openings WLH. The plurality of stack separation insulating layers WLI may include a silicon oxide film, a silicon nitride film, SiON, SiOCN, SiCN, or a combination thereof.

In example embodiments, the plurality of gate electrodes 130 may include a lower common select gate electrode GSL_C, first to third lower select gate electrodes GSL1, GSL2, and GSL3, a plurality of word lines WL, and upper select gate electrodes SSL3, SSL2, SSL1, and SSL_C.

In example embodiments, the lowermost gate electrode 130 may be a lower common select gate electrode GSL_C, and opposing sides of the lower common select gate electrode GSL_C in the second horizontal direction Y may contact the first and second stack separation insulating layers WLIa and WLIb among the plurality of stack separation insulating layers WLI, respectively.

The first lower select gate electrode GSL1 and the third lower select gate electrode GSL3 may be arranged on the lower common select gate electrode GSL_C to be apart from each other. The first lower select gate electrode GSL1 and the third lower select gate electrode GSL3 (e.g., lower surfaces of the first lower select gate electrode GSL1 and the third lower select gate electrode GSL3 or upper surfaces of the first lower select gate electrode GSL1 and the third lower select gate electrode GSL3) may be arranged at the same vertical level. A lower insulating separation layer GI_L may be arranged between the first lower select gate electrode GSL1 and the third lower select gate electrode GSL3, and the lower insulating separation layer GI_L may have an upper surface arranged on the same plane as upper surfaces of the first and third lower select gate electrodes GSL1 and GSL3. One side of the first lower select gate electrode GSL1 in the second horizontal direction Y may be in contact with the first stack separation insulating layer WLIa, and the other side may be in contact with the lower insulating separation layer GI_L. In addition, one side of the third lower select gate electrode GSL3 in the second horizontal direction Y may be in contact with the second stack separation insulating layer WLIb, and the other side may be in contact with the lower insulating separation layer GI_L. As used herein, "an element A and an element B are at the same vertical level" (or similar language) means lower surfaces (and/or upper surfaces) of the elements A and B are coplanar with each other and are spaced apart from the substrate 50 by an equal distance.

As shown in the plan view of FIG. 6, both sides of the lower insulating separation layer GI_L may have a wavy shape. When the side of the first lower select gate electrode GSL1 and the side of the third lower select gate electrode GSL3 in contact with the lower insulating separation layer GI_L are viewed in a plan view, the sides thereof may have a wavy shape.

A second lower select gate electrode GSL2 may be arranged on the first lower select gate electrode GSL1 and the third lower select gate electrode GSL3. The second lower select gate electrode GSL2 may vertically overlap a portion of the first lower select gate electrode GSL1, the lower insulating separation layer GI_L, and a portion of the third lower select gate electrode GSL3. A first upper insulating separation layer GI_U1 and a second upper insulating separation layer GI_U2 may be arranged on both sides of the second lower select gate electrode GSL2. The first upper insulating separation layer GI_U1 and the second upper insulating separation layer GI_U2 may have upper surfaces arranged on the same plane as the upper surface of the second lower select gate electrode GSL2, and the first upper insulating separation layer GI_U1 may be in contact with the first stack separation insulating layer WILa and the second upper insulating separation layer GI_U2 may be in contact with the second stack separation insulating layer WILb.

A plurality of word lines WL may be arranged on the second lower select gate electrode GSL2. Upper select gate electrodes SSL3, SSL2, SSL1, and SSL_C may be arranged on the uppermost word line WL. For example, the third upper select gate electrode SSL3, the second upper select gate electrode SSL2, the first upper select gate electrode SSL1, and the upper common select gate electrode SSL_C may be sequentially arranged on the uppermost word line WL.

Although not shown in the drawing, at least one dummy word line (not shown) is arranged between the uppermost word line WL and the third select gate electrode SSL3 and/or between the lowermost word line WL and the second lower select gate electrode GSL2. Also, in some embodiments, an erase gate electrode may be further arranged below the lower common select gate electrode GSL_C. The erase gate electrode may be used for an erase operation of erasing data stored in memory cells of the memory cell transistors MCT using a gate induced drain leakage (GIDL) phenomenon.

In example embodiments, the lower common select gate electrode GSL_C, the word line WL, and the upper select gate electrodes SSL3, SSL2, SSL1, and SSL_C may be formed of a first conductive material, and the first to third lower select gate electrodes GSL1, GSL2, and GSL3 may be formed of a second conductive material that is different from the first conductive material.

In some examples, the first conductive material may include at least one of W, Ru, Mo, Ni, NiSi, Co, CoSi, Ti, TiN, and WN, and the second conductive material may include at least one of polysilicon, W, Ru, Mo, Ni, NiSi, Co, CoSi, Ti, TiN, and WN.

In some examples, as shown in FIG. 8, when the gate electrode 130 is formed of the first conductive material, the gate electrode 130 may include a buried conductive layer 130A and a conductive barrier layer 130B surrounding the upper, bottom, and side surfaces of the buried conductive layer 130A. The buried conductive layer 130A and the conductive barrier layer 130B may include at least one of W, Ru, Mo, Ni, NiSi, Co, CoSi, Ti, TiN, and WN. In example embodiments, a dielectric liner (not shown) may be further arranged between the conductive barrier layer 130B and the mold insulating layer 132, and the dielectric liner may include a high dielectric material such as aluminum oxide.

The plurality of channel structures 140 may extend in the vertical direction (Z direction) through the plurality of gate electrodes 130 and the plurality of mold insulating layers 132 from the upper surface of the common source plate 110. The plurality of channel structures 140 may be arranged to be spaced apart from each other at preset intervals in the first horizontal direction X, the second horizontal direction Y, and the third horizontal direction (e.g., a diagonal direction). The plurality of channel structures 140 may be arranged in a zigzag shape or a staggered shape. In some embodiments, six channel structures 140 are arranged in a line in the second horizontal direction Y as illustrated in FIG. 3.

An upper insulating layer 150 may be arranged on the channel structure 140 and the uppermost mold insulating layer 132, and a bit line contact BLC connected to the channel structure 140 through the upper insulating layer 150 may be arranged on the channel structure 140 and the uppermost mold insulating layer 132. Bit lines BL may be arranged to extend in the second horizontal direction Y on the upper insulating layer 150.

The bit lines BL may include a first bit line BL1 and a second bit line BL2 that are alternately arranged. For example, the first bit line BL1 may be connected to an odd-numbered channel structure 140 among the six channel structures 140 arranged in a row in the second horizontal direction Y in one memory cell block BLK, and the second bit line BL2 may be connected to an even-numbered channel structure 140 among the six channel structures 140.

In FIG. 5, the odd-numbered channel structure 140 electrically connected to the first bit line BL1 is represented by a first channel CH11, a second channel CH12, and a third channel CH13, and the even-numbered channel structure 140 electrically connected to the second bit line BL2 is represented by a fourth channel CH21, a fifth channel CH22, and a sixth channel CH23. In addition, a plurality of strings MS constituted by the first to sixth channels CH11, CH12, CH13, CH21, CH22, and CH23 are represented by first to sixth strings MS11, MS12, MS13, MS21, MS22, and MS23.

As shown in FIG. 6, at the first vertical level LV1, the first and fourth channels CH11 and CH21 are surrounded by the first lower select gate electrode GSL1, and the third and sixth channels CH13 and CH23 are surrounded by the third lower select gate electrode GSL3. That is, at the first vertical level LV1, the first and fourth strings MS11 and MS21 share the first lower select gate electrode GSL1, and the third and sixth strings MS13 and MS23 share the third lower select gate electrode GSL3. At the first vertical level LV1, at least a portion of the second and fifth channels CH12 and CH22 is surrounded by the lower insulating separation layer GI_L.

As shown in FIG. 7, at the second vertical level LV2, the second and fifth channels CH12 and CH22 are surrounded by the second lower select gate electrode GSL2. At the second vertical level LV2, the second and fifth strings MS12 and MS22 share the second lower select gate electrode GSL2. At the second vertical level LV2, at least a portion of the first and fourth channels CH11 and CH21 is surrounded by the first upper insulating separation layer GI_U1, and at least a portion of the third and sixth channels CH13 and CH23 is surrounded by the second upper insulating separation layer GI_U2.

Each of the plurality of channel structures 140 may be arranged in the channel hole 140H, and may include a gate insulating layer 142, a channel layer 144, a buried insulating layer 146, and a conductive plug 148. The gate insulating layer 142 and the channel layer 144 may be sequentially arranged on a sidewall of the channel hole 140H. For example, the gate insulating layer 142 may be conformally arranged on the sidewall and the bottom of the channel hole 140H, and the channel layer 144 may be conformally arranged on the sidewall and the bottom of the channel hole 140H. The buried insulating layer 146 filling the remaining space of the channel hole 140H may be arranged on the channel layer 144. The conductive plug 148 may be arranged on the upper side of the channel hole 140H to contact the channel layer 144 and block the entrance of the channel hole 140H. In other embodiments, the buried insulating layer 146 may be omitted, and the channel layer 144 may be formed in a pillar shape that fills the remaining portion of the channel hole 140H.

In example embodiments, the bottom surface of the channel layer 144 may be arranged on the gate insulating layer 142 and does not directly contact the common source plate 110, and a bottom portion of a sidewall of the channel layer 144 may contact the horizontal semiconductor layer 114.

As shown in FIG. 8, the gate insulating layer 142 may have a structure including a tunneling dielectric film 142A, a charge storage film 142B, and a blocking dielectric film 142C sequentially on an outer wall of the channel layer 144. The relative thicknesses of the tunneling dielectric film 142A, the charge storage film 142B, and the blocking dielectric film 142C constituting the gate insulating layer 142 are not limited to those illustrated in FIG. 8 and may be variously modified.

The tunneling dielectric film 142A may include silicon oxide, hafnium oxide, aluminum oxide, zirconium oxide, tantalum oxide, or the like. The charge storage film 142B is a region in which electrons passing through the tunneling dielectric film 142A from the channel layer 144 may be stored, and may include silicon nitride, boron nitride, silicon boron nitride, or polysilicon doped with impurities. The blocking dielectric film 142C may be formed of silicon oxide, silicon nitride, or metal oxide having a higher dielectric constant than silicon oxide. The metal oxide may be formed of hafnium oxide, aluminum oxide, zirconium oxide, tantalum oxide, or a combination thereof.

Hereinafter, an equivalent circuit diagram of each block BLK of the semiconductor device 100 will be described with reference to FIG. 9.

As illustrated in FIG. 9, each of the bit lines BL may be electrically connected to at least two strings MS arranged in one block BLK. The bit lines BL may include a first bit line BL1 and a second bit line BL2 that are parallel to each other and are adjacent to each other. Among the bit lines BL, the first bit line BL1 may be an odd-numbered bit line, and the second bit line BL2 may be an even-numbered bit line.

For example, the first to sixth strings MS11, MS12, MS13, MS21, MS22, and MS23 arranged in one direction within one block BLK may be electrically connected to the common source line CSL therebelow. The common source line CSL may be at least a portion of the common source plate 110 of FIG. 4 or at least a portion of the horizontal semiconductor layer 114 electrically connected to the common source plate 110.

The first to third strings MS11, MS12, and MS13 may be electrically connected to the first bit line BL1, and the fourth to sixth strings MS21, MS22, and MS23 may be electrically connected to the second bit line BL2.

Each string MS may include a lower common select transistor GCT, a lower select transistor, memory cell transistors MCT, and upper select transistors connected in series in the vertical direction Z. Although not shown in the drawing, each string MS may further include at least one dummy transistor between the lower select transistors GT1, GT2, and GT3 and the memory cell transistor MCT, and/or between the upper select transistors and the memory cell transistor MCT.

For example, in each string MS, the upper select transistors may include first upper select transistors ST1a, ST1b, and ST1c positioned at the same height level as each other, second upper select transistors ST2a, ST2b, and ST2c positioned at the same height level below the first upper select transistors ST1a, ST1b, and ST1c, third upper select transistors ST3a, ST3b, and ST3c positioned at the same height level below the second upper select transistors ST2a, ST2b, and ST2c, and an upper common select transistor SCT on the first upper select transistors ST1a, ST1b, and ST1c.

In the one block BLK, among the memory cell transistors MCT, the memory cell transistors MCT positioned at the same height level may share one word line WL, and among the upper select transistors, upper select transistors positioned at the same height level may share one upper select gate electrode. Here, the one word line WL may have opposing sides in contact with the first and second stack separation insulating layers WLIa and WLIb, respectively, and the one upper select gate electrode may have opposing sides in contact with the first and second stack separation insulating layers WLIa and WLIb, respectively. As used herein, a common gate electrode of transistors A and B refers to a single gate electrode that functions as gates of the transistors A and B.

For example, in one block BLK, the first upper select transistor ST1a of the first string MS11, the first upper select transistor ST1b of the second string MS12, the first upper select transistor ST1c of the third string MS13, the first upper select transistor ST1a of the fourth string MS21, the first upper select transistor ST1b of the fifth string MS22, and the first upper select transistor ST1c of the sixth string MS23 may share one first upper select gate electrode SSL1. Similarly, in one block BLK, the second upper select transistors ST2a, ST2b, and ST2c positioned at the same height level may share one second upper select gate electrode SSL2, and the third upper select transistors ST3a, ST3b, and ST3c positioned at the same height level may share one third upper select gate electrode SSL3.

In one block BLK, the lower common select transistors GCT positioned at the same height level may share one lower common select gate electrode GSL_C, and the upper common select transistors SCT positioned at the same height level may share one upper common select gate electrode SSLC.

In one block BLK, the lower selection transistor GT1 of the first string MS11 electrically connected to the first bit line BL1 and the lower select transistor GT1 of the fourth string MS21 electrically connected to the second bit line BL2 may share one first lower select gate electrode GSL1, the lower selection transistor GT2 of the second string MS12 electrically connected to the first bit line BL and the lower select transistor GT2 of the fifth string MS22 electrically connected to the second bit line BL2 may share one second lower select gate electrode GSL2, and the lower selection transistor GT3 of the third string MS13 electrically connected to the first bit line BL1 and the lower select transistor GT3 of the sixth string MS23 electrically connected to the second bit line BL2 may share one third lower select gate electrode GSL3. The first lower select gate electrode GSL1 and the third lower select gate electrode GSL3 may be arranged at the same level and may be electrically separated (e.g., electrically isolated) from each other. The second lower select gate electrode GSL2 may be arranged at a different vertical level from the first and third lower select gate electrodes GSL1 and GSL3 (e.g., at a higher vertical level as shown in FIG. 9 or at a lower vertical level contrary to what is shown in FIG. 9), and may be electrically separated (e.g., electrically isolated) from the first and third lower select gate electrodes GSL1 and GSL3.

In the first and fourth strings MS11 and MS21, the first upper select transistor ST1a may have a first threshold voltage VT1 (refer to FIG. 11), and the second and third upper select transistors ST2a and ST3a may have a second threshold voltage VT2 (refer to FIG. 11) that is different from the first threshold voltage VT1. In the second and fifth strings MS12 and MS22, the second upper select transistor ST2b may have the first threshold voltage VT1, and the first and third upper select transistors ST1b and ST3b may have the second threshold voltage VT2 that is different from the first threshold voltage VT1. In the third and sixth strings MS13 and MS23, the third upper select transistor ST3c may have the first threshold voltage VT1, and the first and second upper select transistors ST1c and ST2c may have the second threshold voltage VT2 that is different from the first threshold voltage VT1. In example embodiments, the second threshold voltage VT2 may be greater than the first threshold voltage VT1. In some examples, the first threshold voltage VT1 may be a negative voltage, and the second threshold voltage VT2 may be a positive voltage. In other examples, the second threshold voltage VT2 may be greater than the first threshold voltage VT1 by about 2 V or more.

According to the semiconductor device 100 according to the example embodiments described with reference to FIGS. 2 to 9, a block BLK in which six or more channels are connected may be implemented even without a separate string separation insulating layer. In particular, the semiconductor device 100 may include the second lower select gate electrode GSL2 arranged at a different vertical level from the first lower select gate electrode GSL1 and the third lower select gate electrode GSL3. Therefore, misalignment, and the like caused by a relatively small separation distance between a channel hole and a common source line cut, which occurs when first to third lower select gate electrodes are arranged at the same vertical level, may be reduced or prevented. Accordingly, the manufacturing process of the semiconductor device 100 may be precisely controlled.

Hereinafter, a method of setting threshold voltages of upper select transistors of the semiconductor device 100 will be described with reference to FIGS. 10 to 13.

Figure 10:
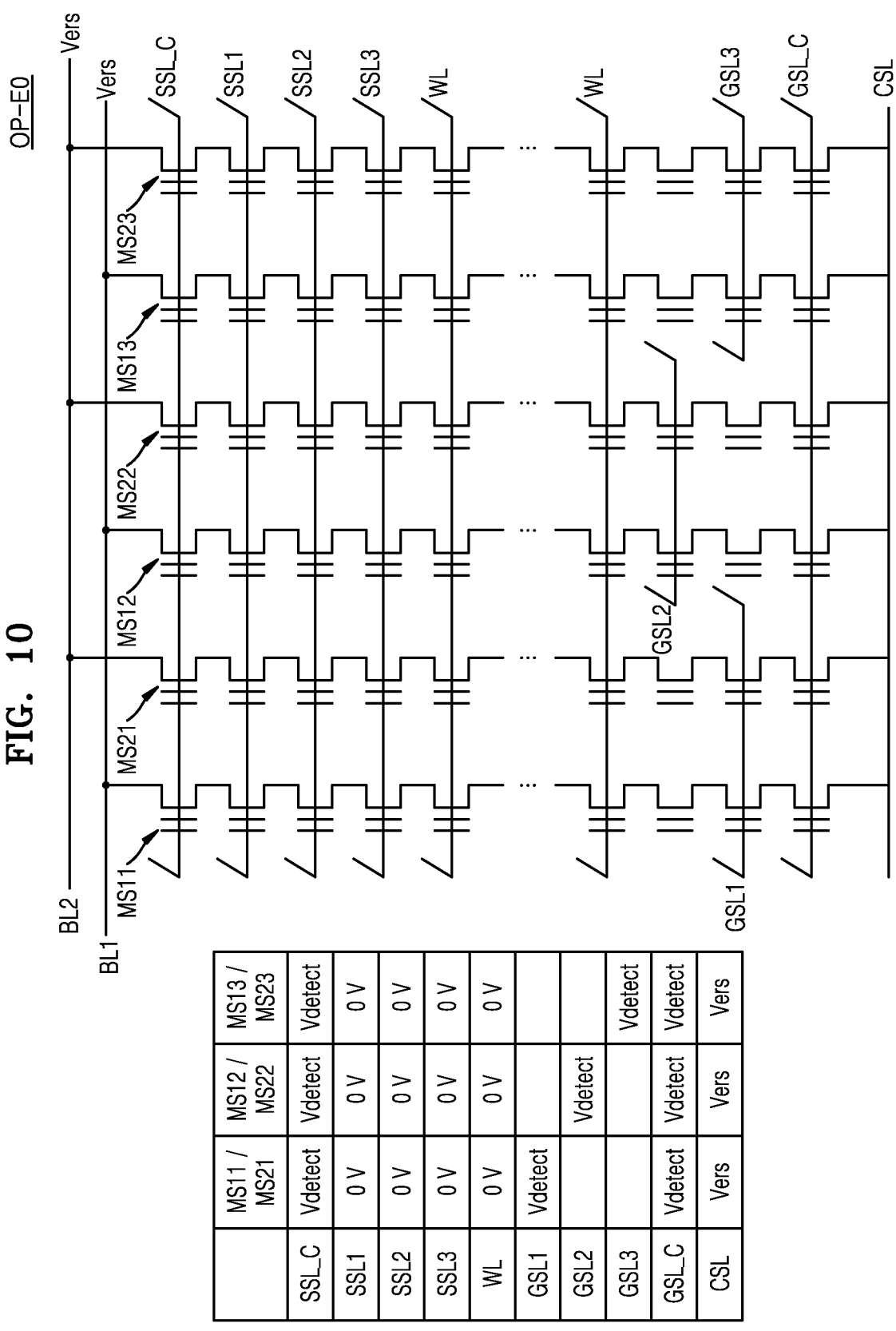
FIG. 10 is a schematic diagram illustrating an initial erase operation of a semiconductor device.
Figure 11:
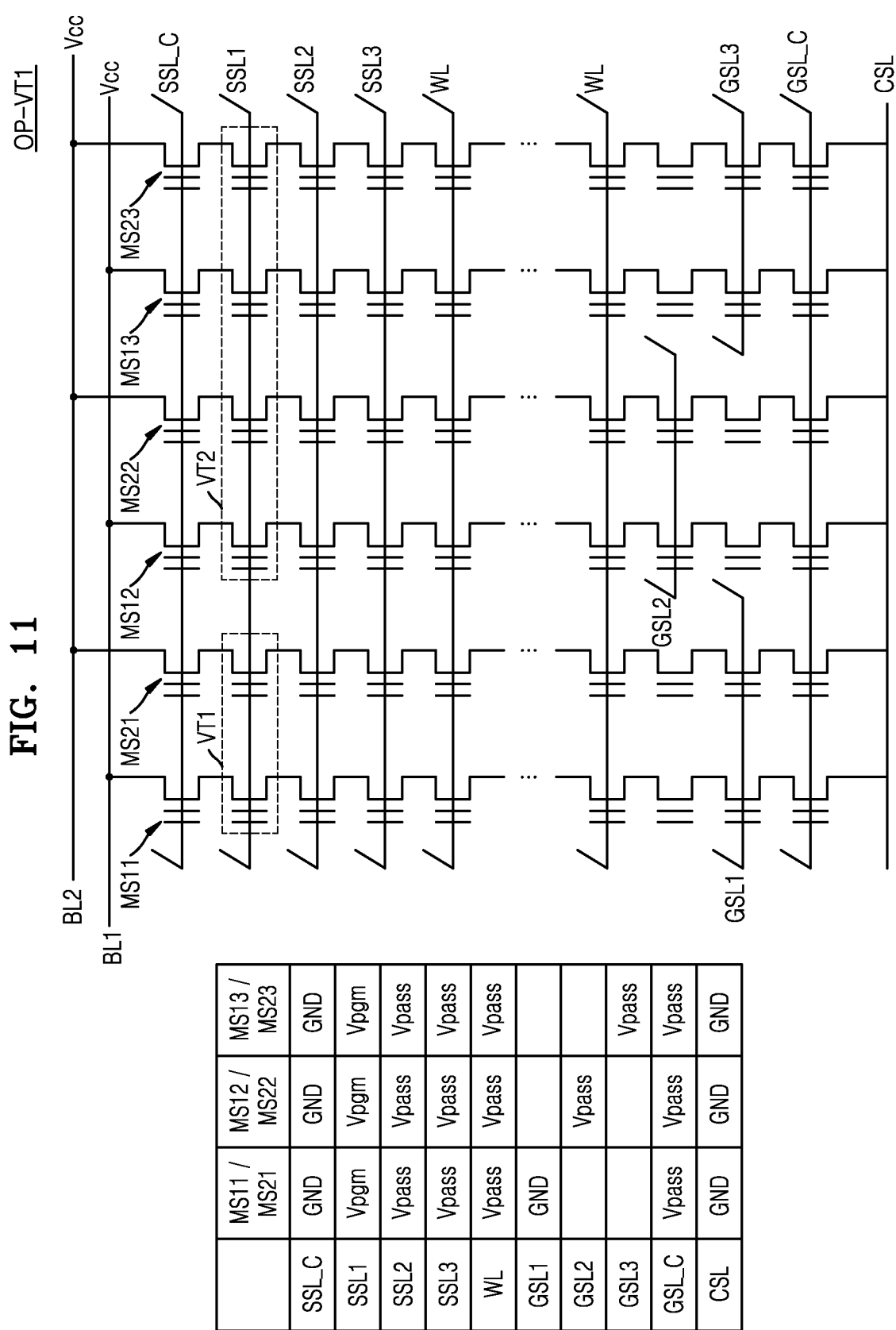
FIG. 11 is a schematic diagram illustrating a threshold voltage setting operation of a first upper select transistor.
Figure 12:
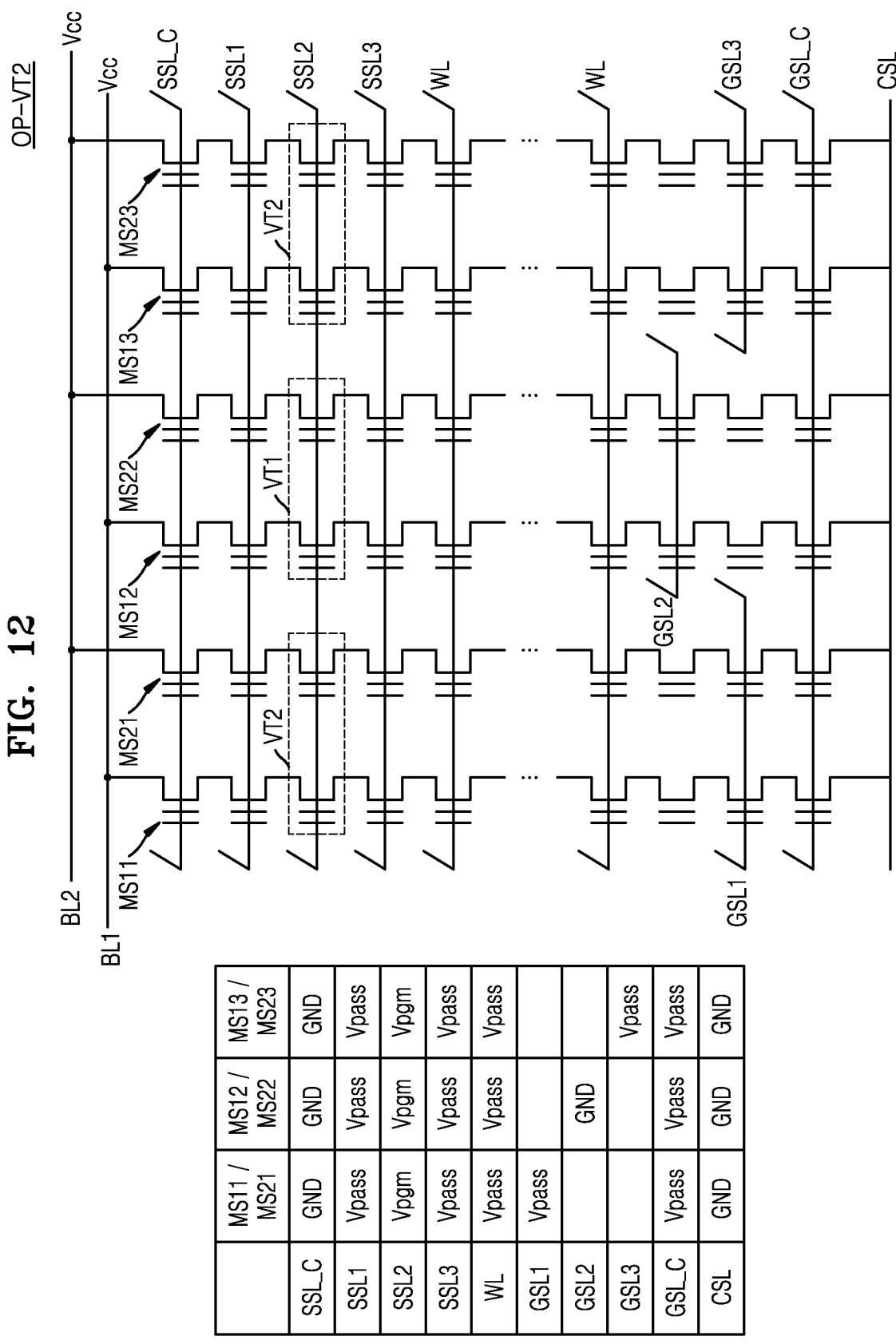
FIG. 12 is a schematic diagram illustrating a threshold voltage setting operation of a second upper select transistor.
Figure 13:
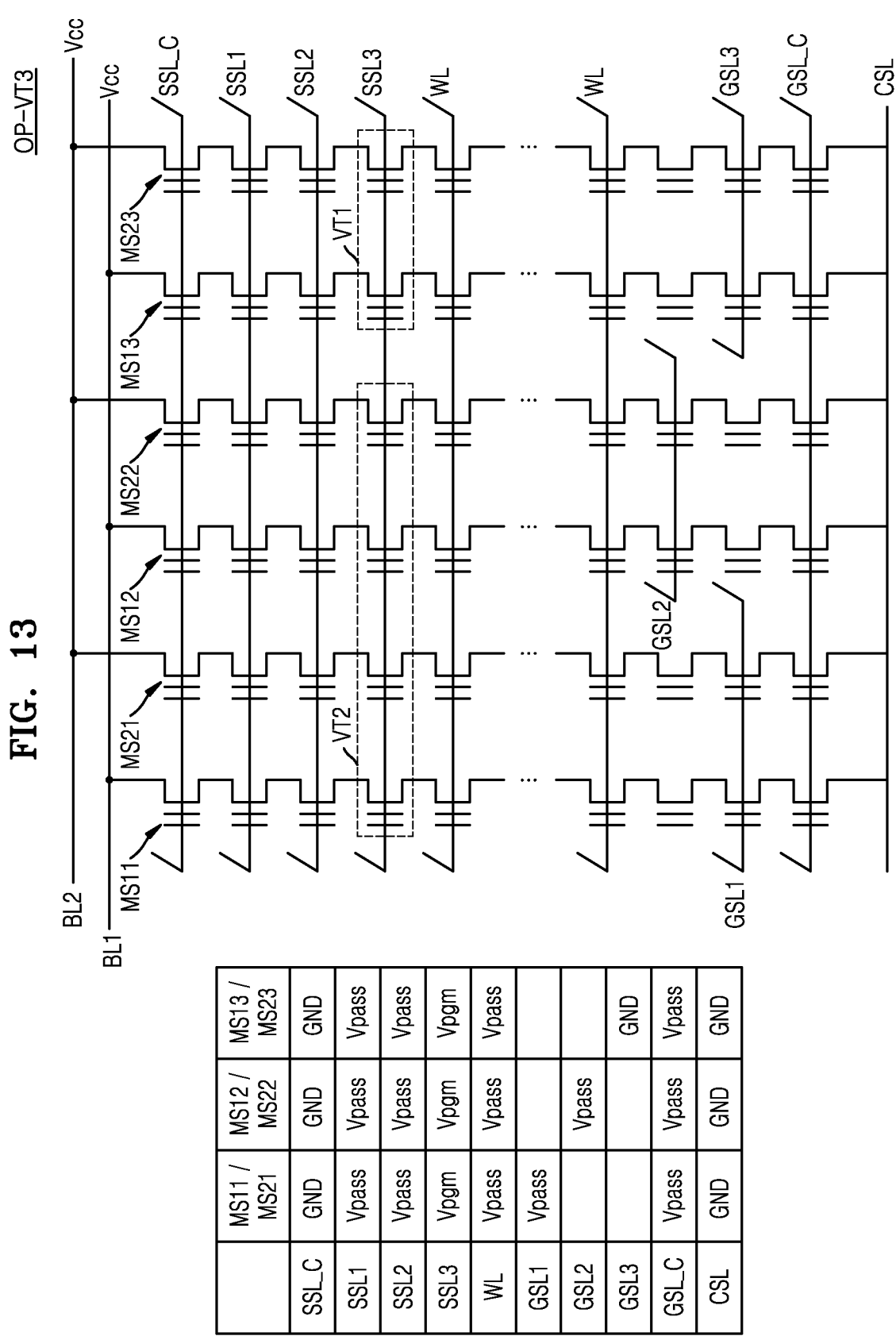
FIG. 13 is a schematic diagram illustrating a threshold voltage setting operation of a third upper select transistor.

FIG. 10 is a schematic diagram illustrating an initial erase operation OP-E0 of the semiconductor device 100, FIG. 11 is a schematic diagram illustrating a first threshold voltage setting operation OP-VT1 of a first upper select transistor, FIG. 12 is a schematic diagram illustrating a second threshold voltage setting operation OP-VT2 of a second upper select transistor, and FIG. 13 is a schematic diagram illustrating a third threshold voltage setting operation OP-VT3 of a third upper select transistor.

Referring to FIG. 10, the erase operation OP-E0 may be performed on upper select transistors ST1a, ST1b, ST1c, ST2a, ST2b, ST2c, ST3a, ST3b, and ST3c of a memory cell block BLK. To perform an erase operation in which electrons trapped in a charge storage film 142B of the upper select transistors ST1a, ST1b, ST1c, ST2a, ST2b, ST2c, ST3a, ST3b, and ST3c escape into the channel layer 144, an erase voltage Vers may be applied to the channel layer 144 of the upper select transistors ST1a, ST1b, ST1c, ST2a, ST2b, ST2c, ST3a, ST3b, and ST3c, and 0 V may be applied to the first to third upper select gate electrodes SSL1, SSL2, and SSL3.

In an example embodiment, to apply the erase voltage Vers to the channel layer 144 of the upper select transistors ST1a, ST1b, ST1c, ST2a, ST2b, ST2c, ST3a, ST3b, and ST3c, the common source line CSL and the erase voltage Vers may be applied to the bit lines BL1 and BL2.

To prevent an erase operation from occurring on the common upper select transistor SCT, the common lower select transistor GCT, and the first to third lower select transistors GT1, GT2, and GT3, a sensing voltage Vdetect may be applied to the upper common select gate electrode SSL_C, the lower common select gate electrode GSL_C, and the first to third lower select gate electrodes GSL1, GSL2, and GSL3. The sensing voltage Vdetect may be greater than 0 V and less than the erase voltage Vers.

Also, 0 V may be applied to the word lines WL to perform an erase operation on the memory cell transistors MCT.

Referring to FIG. 11, a first threshold voltage setting operation OP-VT1 may be performed on the first upper select transistors ST1a, ST1b, and ST1c of the memory cell block BLK. In the first threshold voltage setting operation OP-VT1, a first threshold voltage VT1 may be set in the first upper select transistors ST1a of the first and fourth strings MS11 and MS21, a second threshold voltage VT2 may be set in the first upper select transistors ST1b of the second and fifth strings MS12 and MS22, and a second threshold voltage VT2 may be set in the first upper select transistors ST1c of the third and sixth strings MS13 and MS23.

In example embodiments, a power voltage Vcc may be applied to the bit lines BL, a ground voltage GND may be applied to the upper common select gate electrode SSL_C, a pass voltage Vpass may be applied to the second and third upper select gate electrodes SSL2 and SSL3, the word lines WL, and the lower common select gate electrode GSL_C, the ground voltage GND may be applied to the common source line CSL, the ground voltage GND may be applied to the first lower select gate electrode GSL1, the pass voltage Vpass may be applied to the second and third lower select gate electrodes GSL2 and GSL3, and a program voltage Vpgm may be applied to the first upper select gate electrode SSL1.

Here, the first to third lower select transistors GT1, GT2, and GT3 may have the same threshold voltage, and by applying the ground voltage GND to the first lower select gate electrode GSL1, the first lower select transistor GT1 including the first lower select gate electrode GSL1 may be in an off state. Also, by applying the pass voltage Vpass to the second and third lower select gate electrodes GSL2 and GSL3, the second and third lower select transistors GT2 and GT3 may be in an on state. Here, the pass voltage Vpass may be a voltage higher than the threshold voltages of the second and third lower select transistors GT2 and GT3. By applying a voltage in this way, electrons are trapped into the charge storage film 142B of the first upper select transistors ST1b and ST1c of the second, third, fifth, and sixth strings MS12, MS13, MS22, and MS23, such that the first upper select transistors ST1b and ST1c of the second, third, fifth, and sixth strings MS12, MS13, MS22, and MS23 may be programmed to have the second threshold voltage VT2.

Referring to FIG. 12, the second threshold voltage setting operation OP-VT2 may be performed on the second upper select transistors ST2a, ST2b, and ST2c of the memory cell block BLK. In the second threshold voltage setting operation OP-VT2, a first threshold voltage VT1 may be set in the second upper select transistors ST2b of the second and fifth strings MS12 and MS22, a second threshold voltage VT2 may be set in the second upper select transistors ST2a of the first and fourth strings MS11 and MS21, and the second threshold voltage VT2 may be set in the second upper select transistors ST2c of the third and sixth strings MS13 and MS23.

In example embodiments, a power voltage Vcc may be applied to the bit lines BL, aground voltage GND may be applied to the upper common select gate electrode SSL_C, a pass voltage Vpass may be applied to the first and third upper select gate electrodes SSL1 and SSL3, the word lines WL, and the lower common select gate electrode GSL_C, the ground voltage GND may be applied to the common source line CSL, the ground voltage GND may be applied to the second lower select gate electrode GSL2, the pass voltage Vpass may be applied to the first and third lower select gate electrodes GSL1 and GSL3, and a program voltage Vpgm may be applied to the second upper select gate electrode SSL2.

By applying a voltage in this way, electrons are trapped into the charge storage film 142B of the second upper select transistors ST2a and ST2c of the first, third, fourth, and sixth strings MS11, MS13, MS21, and MS23, such that the second upper select transistors ST2a and ST2c of the first, third, fourth, and sixth strings MS11, MS13, MS21, and MS23 may be programmed to have the second threshold voltage VT2.

Referring to FIG. 13, the third threshold voltage setting operation OP-VT3 may be performed on the third upper select transistors ST3a, ST3b, and ST3c of the memory cell block BLK. In the third threshold voltage setting operation OP-VT3, a first threshold voltage VT1 may be set in the third upper select transistors ST3c of the third and sixth strings MS13 and MS23, a second threshold voltage VT2 may be set in the third upper select transistors ST3a of the first and fourth strings MS11 and MS21, and the second threshold voltage VT2 may be set in the third upper select transistors ST3b of the second and fifth strings MS12 and MS22.

In example embodiments, a power voltage Vcc may be applied to the bit lines BL, a ground voltage GND may be applied to the upper common select gate electrode SSL_C, a pass voltage Vpass may be applied to the first and second upper select gate electrodes SSL1 and SSL2, the word lines WL, and the lower common select gate electrode GSL_C, the ground voltage GND may be applied to the common source line CSL, the ground voltage GND may be applied to the third lower select gate electrode GSL3, the pass voltage Vpass may be applied to the first and second lower select gate electrodes GSL1 and GSL2, and a program voltage Vpgm may be applied to the third upper select gate electrode SSL3.

By applying a voltage in this way, electrons are trapped into the charge storage film 142B of the third upper select transistors ST3a and ST3c of the first, third, fourth, and sixth strings MS11, MS13, MS21, and MS23, such that the third upper select transistors ST3a and ST3c of the first, third, fourth, and sixth strings MS11, MS13, MS21, and MS23 may be programmed to have the second threshold voltage VT2.

Figure 14:
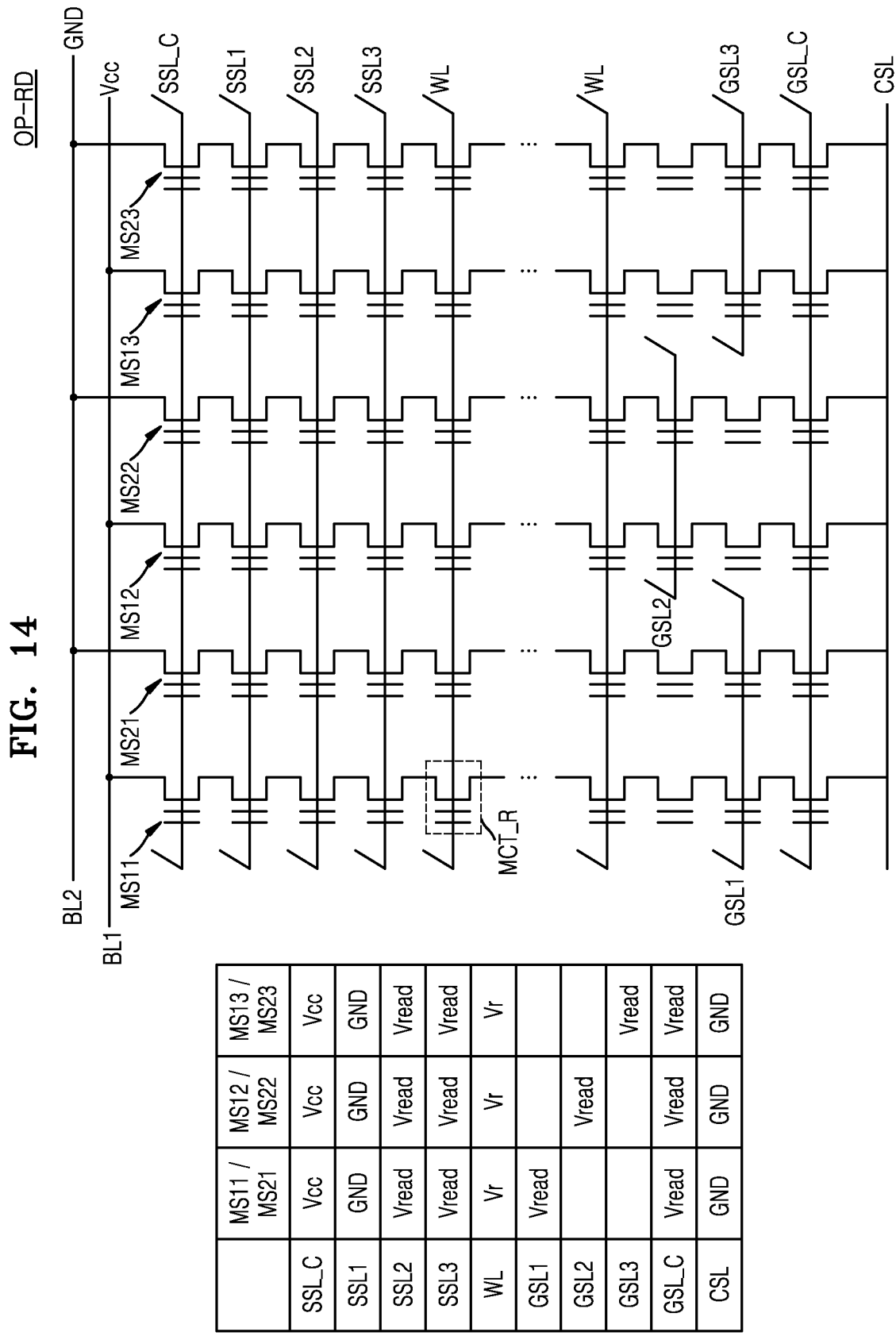
FIG. 14 is a schematic diagram illustrating a read operation of a memory cell transistor of a semiconductor device.

FIG. 14 is a schematic diagram illustrating a read operation OP-RD of the memory cell transistor MCT of the semiconductor device 100.

Referring to FIG. 14, a case where the target memory cell transistor MCT_R, which is the target of the read operation, is a memory cell transistor MCT included in the first string MS11 and connected to the first bit line BL1 will be described as an example. A power voltage Vcc may be applied to the first bit line BL1 connected to the target memory cell transistor MCT_R, a ground voltage GND may be applied to the second bit line BL2, the ground voltage GND may be applied to the common source line CSL, the ground voltage GND may be applied to the first upper select gate electrode SSL1 connected to the target memory cell transistor MCT_R among the first to third upper select gate electrodes SSL1, SSL2, and SSL3, a read pass voltage Vread may be applied to the remaining upper select gate electrodes SSL2 and SSL3, and the read voltage V may be applied to the word lines WL. The read pass voltage Vread may be applied to the lower common select gate electrode GSL_C and the first to third lower select gate electrodes GSL1, GSL2, and GSL3.

Here, among the select transistors ST1a, ST1b, and ST1c sharing the select gate electrode SSL1 to which the ground voltage GND is applied, the upper select transistor (i.e., the first upper select transistor ST1a) having the first threshold voltage VT1 may be in an ON-state, and the upper select transistors (i.e., the second and third upper select transistors ST1b and ST1c) having the second threshold voltage VT2 may be in an OFF-state.

Figure 15:
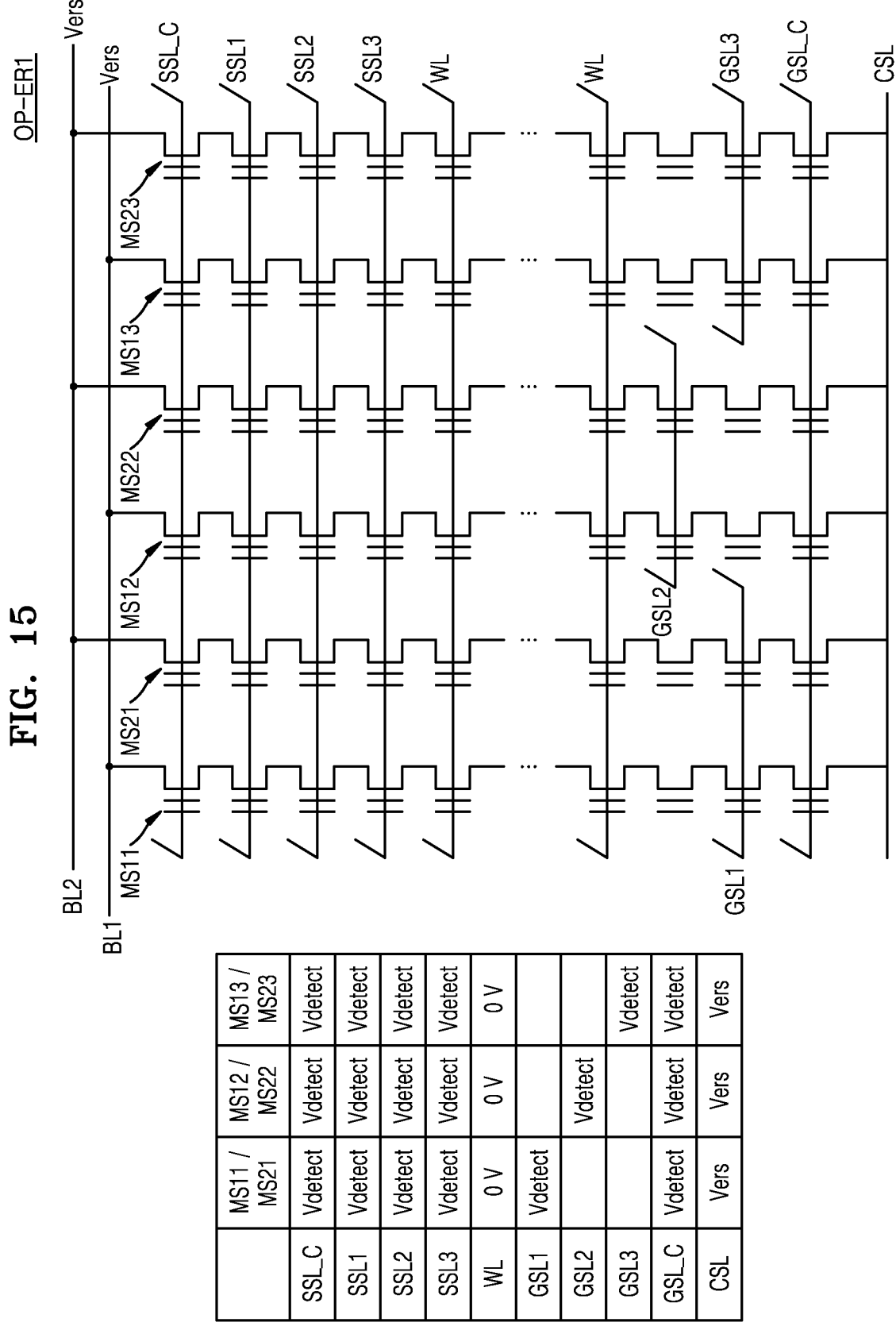
FIG. 15 is a schematic diagram illustrating an erase operation of a memory cell transistor of a semiconductor device.

FIG. 15 is a schematic diagram illustrating an erase operation OP-ER1 of the memory cell transistor MCT of the semiconductor device 100.

Referring to FIG. 15, 0 V may be applied to the word lines WL of the memory cell transistors MCT, and the erase voltage Vers may be applied to the bit lines BL1 and BL2 and the common source line CSL. Accordingly, due to the F-N tunneling phenomenon occurring while the erase voltage is applied to the channel layer 144 of the memory cell transistors MCT, electrons trapped in the charge storage film 142B of the memory cell transistors MCT may escape into the channel layer 144. On the other hand, to prevent the erase operation from occurring on the upper select transistors, the upper common transistor SCT, and the first to third lower select transistors GT1, GT2, and GT3, the sensing voltage Vdetect may be applied to the first to third upper select gate electrodes SSL1, SSL2, and SSL3, the upper common select gate electrode SSL_C, the lower common select gate electrode GSL_C, and the lower select gate electrodes GSL1, GSL2, and GSL3. The sensing voltage Vdetect may be greater than 0 V and less than the erase voltage Vers.

Figure 16:
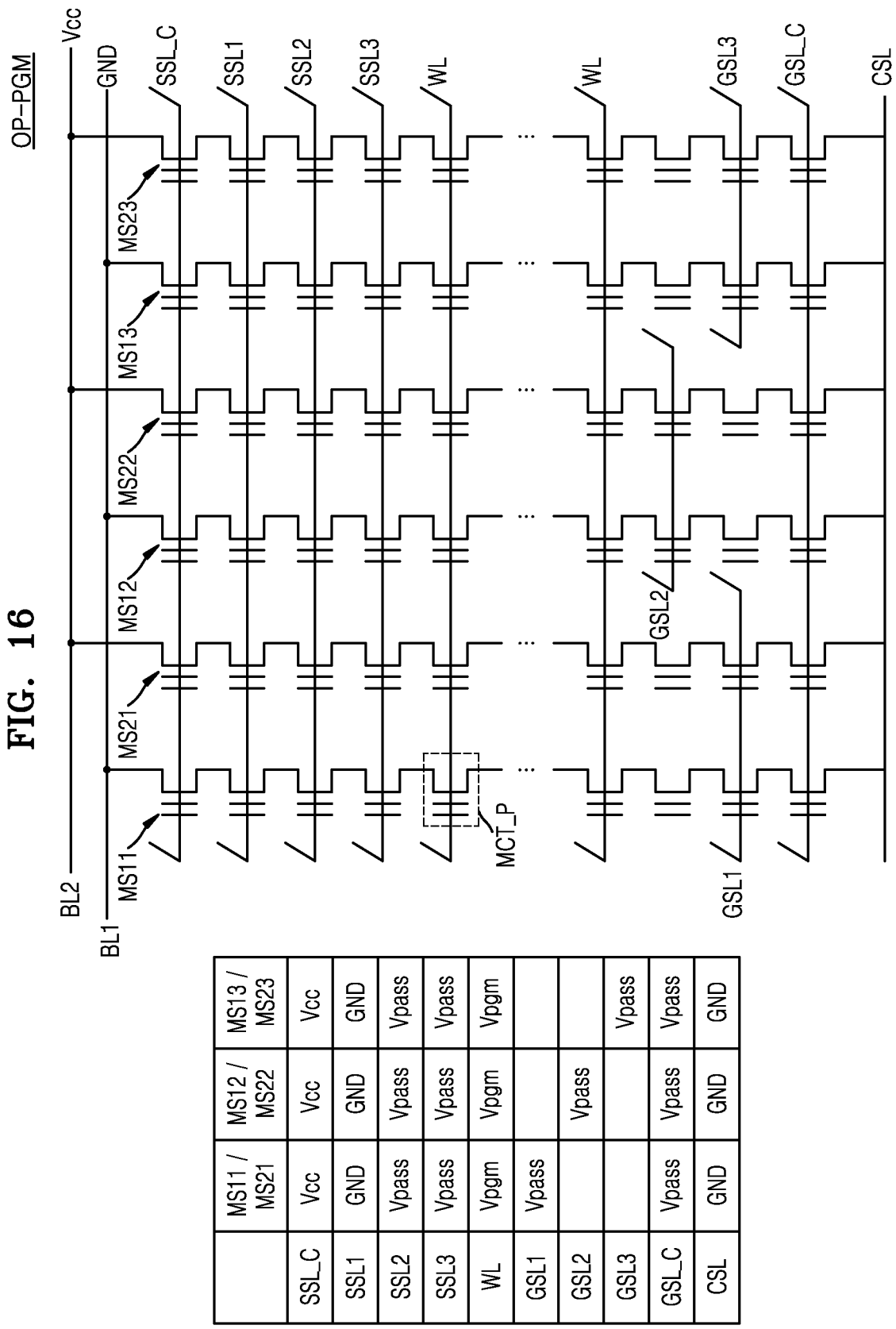
FIG. 16 is a schematic diagram illustrating a programming operation of a memory cell transistor of a semiconductor device.

FIG. 16 is a schematic diagram illustrating a programming operation OP-PGM for programming information into a memory cell transistor MCT of the semiconductor device 100.

Referring to FIG. 16, a case where the target memory cell transistor MCT_P, which is the target of the programming operation, is a memory cell transistor MCT included in the first string MS11 and connected to the first bit line BL1 will be described as an example. A ground voltage GND may be applied to the first bit line BL1 connected to the target memory cell transistor MCT_P, a power voltage Vcc may be applied to the second bit line BL2, the ground voltage GND may be applied to the common source line CSL, the power voltage Vcc may be applied to the upper common select gate electrode SSL_C, the ground voltage GND may be applied to the first upper select gate electrode SSL1 connected to the target memory cell transistor MCT_P among the first to third upper select gate electrodes SSL1, SSL2, and SSL3, a pass voltage Vpass may be applied to the remaining upper select gate electrodes SSL2 and SSL3, and a programming voltage Vpgm may be applied to the word lines WL. The pass voltage Vpass may be applied to the lower common select gate electrode GSL_C and the first to third lower select electrodes GSL1, GSL2, and GSL3.

Here, among the first upper select transistors ST1a, ST1b, and ST1c sharing the upper select gate electrode SSL1 to which the ground voltage GND is applied, the select transistor (i.e., the first upper select transistor ST1a) having the first threshold voltage VT1 may be turned on, and the upper select transistors (i.e., the second and third upper select transistors ST1b and ST1c) having the second threshold voltage VT2 may be turned off.

Figure 17:
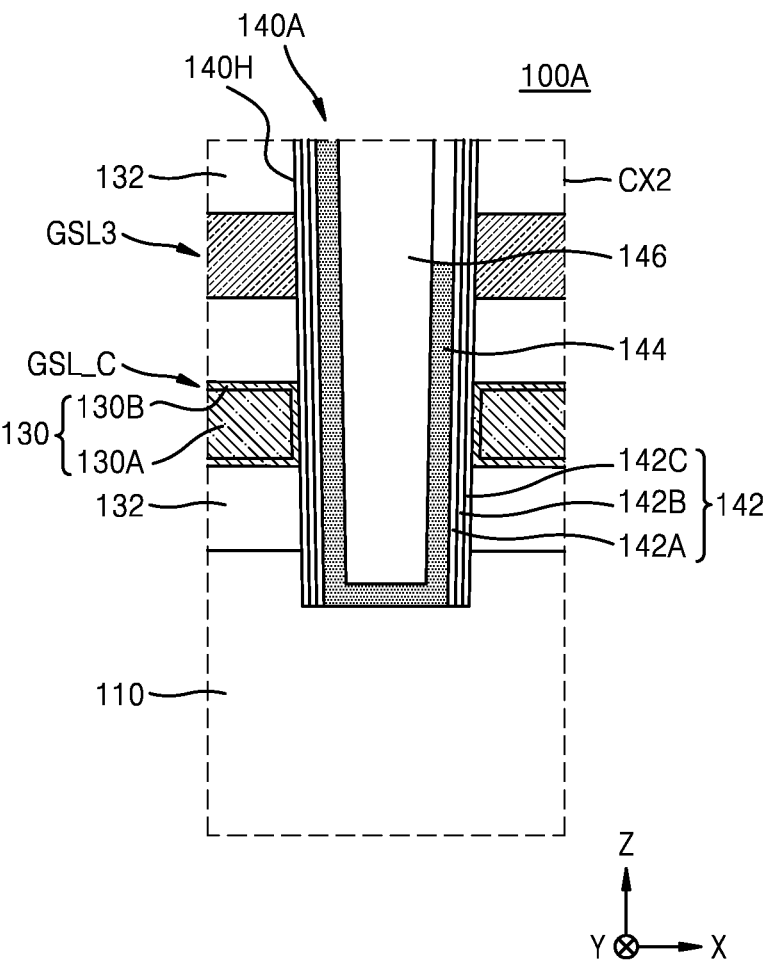
FIG. 17 is a cross-sectional view illustrating a semiconductor device according to example embodiments.

FIG. 17 is a cross-sectional view illustrating a semiconductor device 100A according to example embodiments.

Referring to FIG. 17, a channel structure 140A includes a gate insulating layer 142, a channel layer 144, a buried insulating layer 146, and a conductive plug (e.g., the conductive plug 148 in FIG. 4), and a gate insulating layer 142 may be arranged on a sidewall of a channel hole 140H and may expose a bottom of the channel hole 140H, and the channel layer 144 may be arranged on the gate insulating layer 142, and a bottom surface of the channel layer 144 may directly contact a common source plate 110. The horizontal semiconductor layer 114 (refer to FIG. 4) and the support layer 116 (refer to FIG. 4) between the common source plate 110 and the lowermost mold insulating layer 132 may be omitted.

Figure 18:
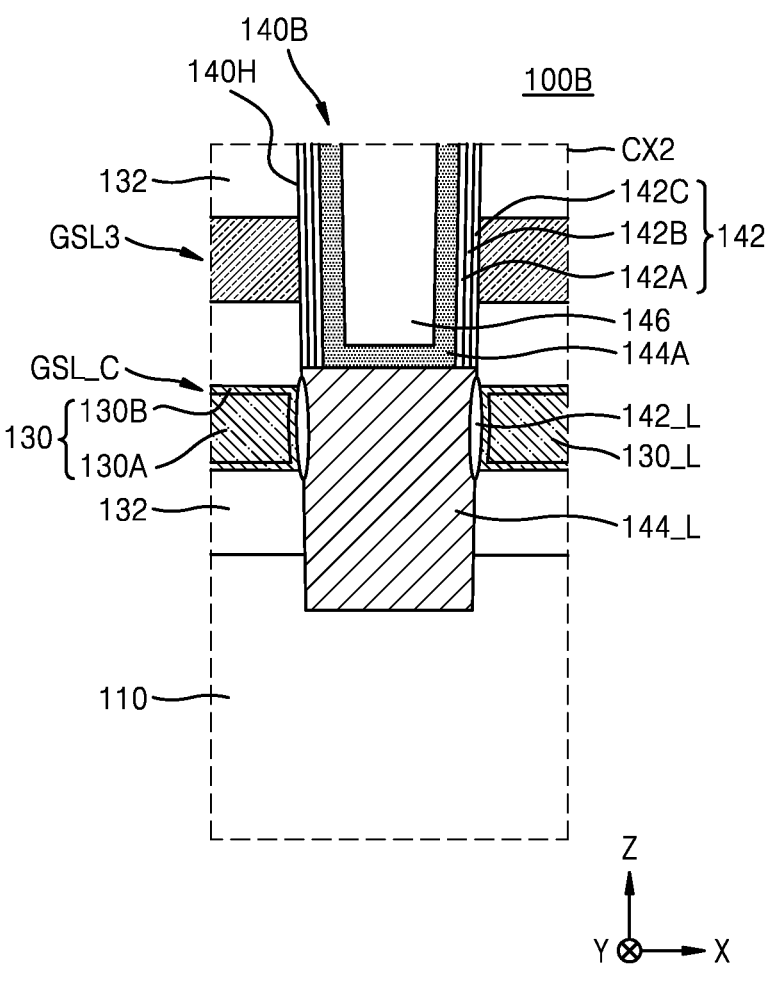
FIG. 18 is a cross-sectional view illustrating a semiconductor device according to example embodiments.

FIG. 18 is a cross-sectional view illustrating a semiconductor device 100B according to example embodiments.

Referring to FIG. 18, a channel structure 140B includes a gate insulating layer 142, a channel layer 144, a buried insulating layer 146, and a conductive plug 148, and may further include a contact semiconductor layer 144_L and a bottom insulating layer 142_L arranged on the bottom of the channel hole 140H. The channel layer 144 does not directly contact the common source plate 110, and may be electrically connected to the common source plate 110 through the contact semiconductor layer 144_L. In example embodiments, the contact semiconductor layer 144_L may include a silicon layer formed by a selective epitaxy growth (SEG) process using the common source plate 110 arranged at the bottom of the channel hole 140H as a seed layer.

A bottom insulating layer 142_L may be arranged between the lowermost gate electrode 130_L and the contact semiconductor layer 144_L. In example embodiments, the bottom insulating layer 142_L may include silicon oxide and, for example, may be formed by performing an oxidation process on a portion of a sidewall of the contact semiconductor layer 144_L.

Figure 19:
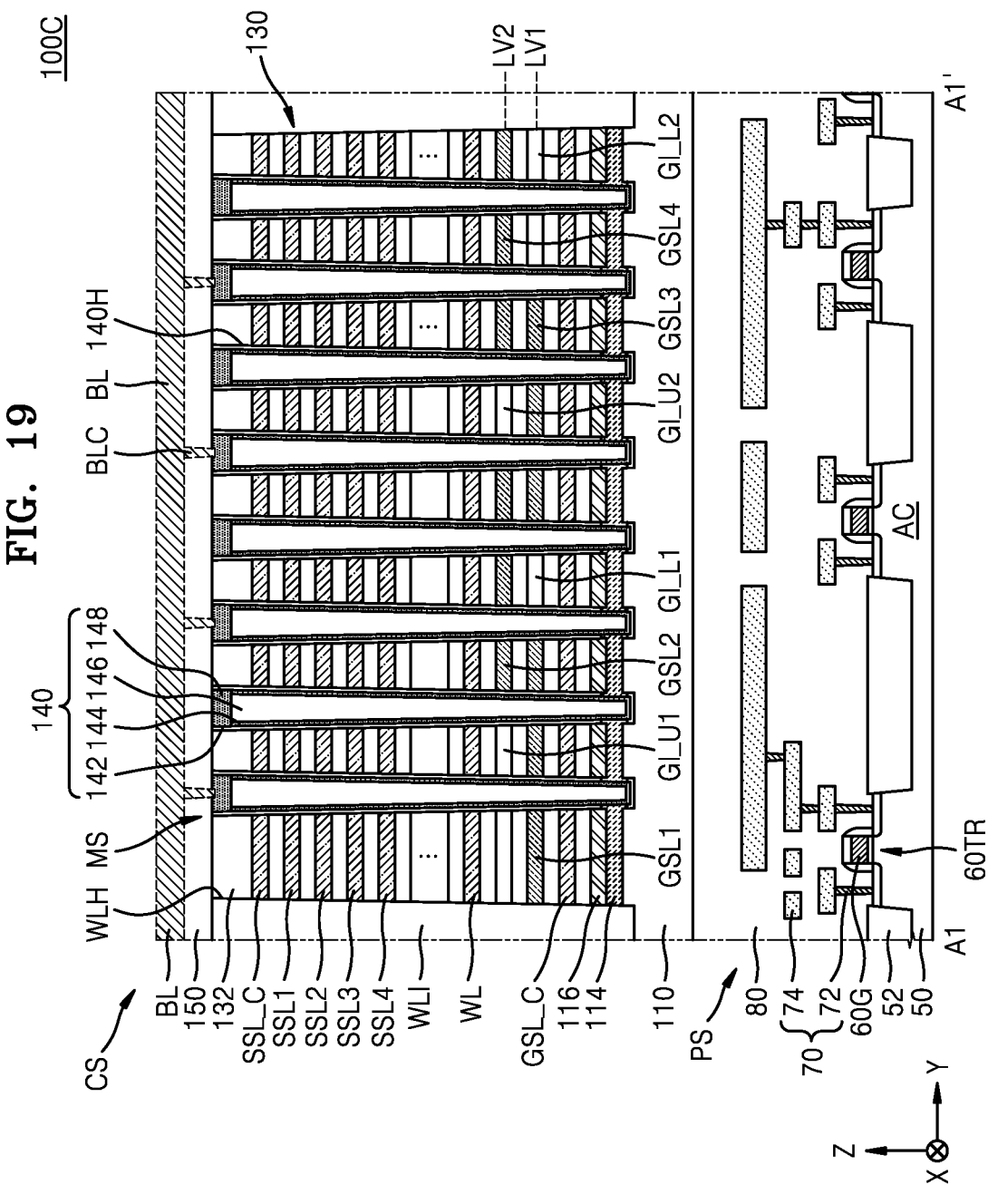
FIG. 19 is a cross-sectional view illustrating a semiconductor device according to example embodiments.
Figure 20:
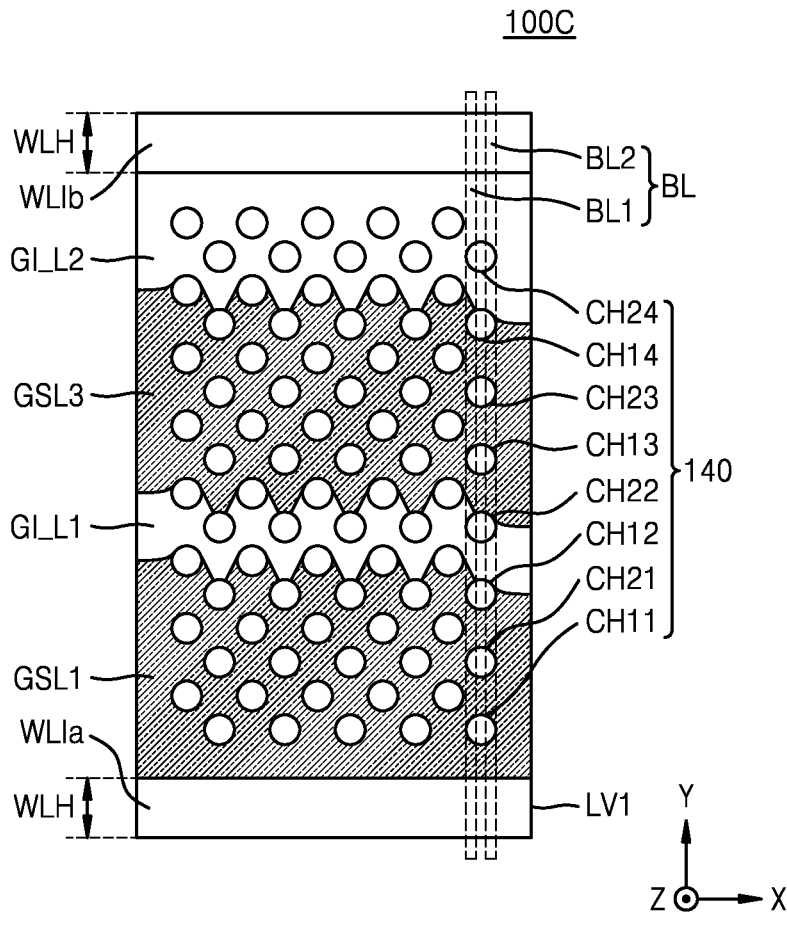
FIG. 20 is a horizontal cross-sectional view at a first vertical level LV1 of FIG. 19 according to example embodiments.
Figure 21:
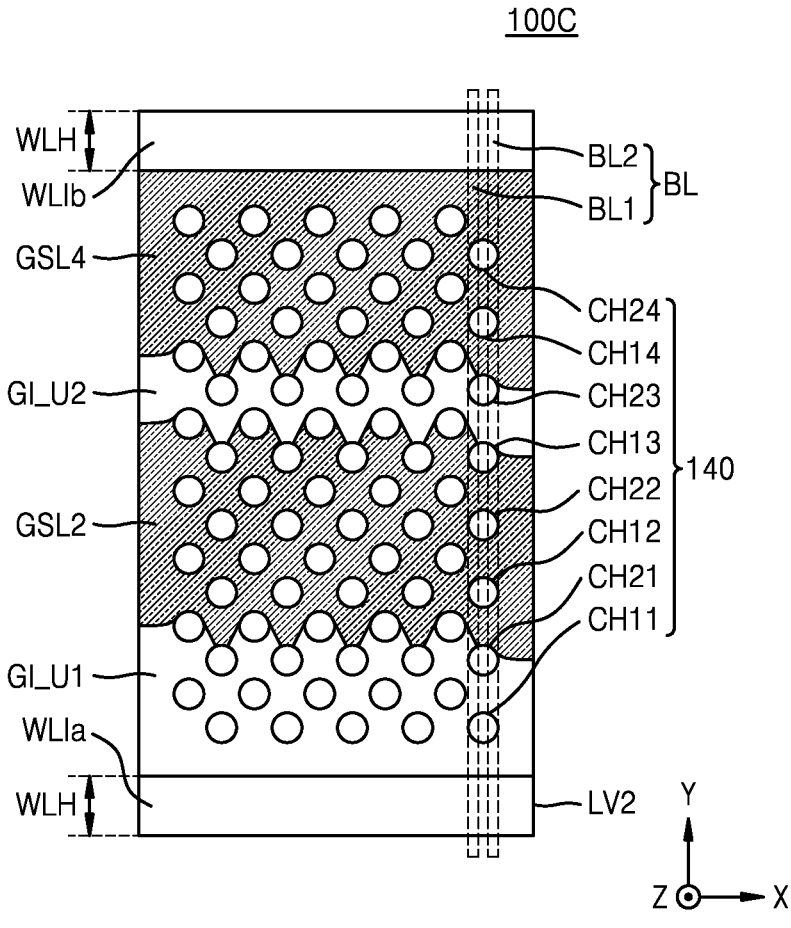
FIG. 21 is a horizontal cross-sectional view at a second vertical level LV2 of FIG. 19 according to example embodiments.

FIG. 19 is a cross-sectional view illustrating a semiconductor device 100C according to example embodiments. FIG. 20 is a horizontal cross-sectional view at a first vertical level LV1 of FIG. 19, and FIG. 21 is a horizontal cross-sectional view at a second vertical level LV2 of FIG. 19. In FIGS. 19 to 21, the same reference numerals as in FIGS. 1 to 18 indicate the same components.

Referring to FIGS. 19 to 21, one memory cell block BLK defined between the first and second stack separation insulating layers WLIa and WLIb may include eight channel structures 140 arranged in a row along the second horizontal direction Y. Here, the channel structure 140 connected to the first bit line BL1 and arranged adjacent to the sixth channel CH6 is represented by a seventh channel CH14, and the channel structure 140 connected to the second bit line BL2 and arranged adjacent to the seventh channel CH14 is represented by an eighth channel CH24.

At the first vertical level LV1, a third lower select gate electrode GSL3 may be arranged to be spaced apart from the first lower select gate electrode GSL1, and a first lower insulating separation layer GI_L1 may be arranged therebetween. In addition, the third lower select gate electrode GSL3 does not directly contact the second stack separation insulating layer WLIb, and a second lower insulating separation layer GI_L2 may be arranged between the third lower select gate electrode GSL3 and the second stack separation insulating layer WLIb.

At the second vertical level LV2, the fourth lower select gate electrode GSL4 may be arranged to be spaced apart from the second lower select gate electrode GSL2, and a second upper insulating separation layer GI_U2 may be arranged therebetween. At the second vertical level LV2, the fourth lower select gate electrode GSL4 may surround the seventh channel CH14 and the eighth channel CH24, and at the first vertical level LV1, at least a portion of the seventh channel CH14 and the eighth channel CH24 may be surrounded by the second lower insulating separation layer GI_L2.

Meanwhile, a fourth upper select gate electrode SSL4 may be further arranged below the third upper select gate electrode SSL3. The seventh channel CH14 may constitute a seventh string (not shown), and the eighth channel CH24 may constitute an eighth string (not shown).

According to the semiconductor device 100C according to example embodiments, a block BLK in which eight or more channels are connected may be implemented even if there is no separate string separation insulating layer. In addition, the first and third lower select gate electrodes GSL1 and GSL3 may be arranged at different vertical levels from the second and fourth lower select gate electrodes GSL2 and GSL4, and accordingly, misalignment due to a relatively small separation distance between the channel hole and the common source line cut may be reduced or prevented. In some embodiments, lower surfaces of the first and third lower select gate electrodes GSL1 and GSL3 may be coplanar with each other, and lower surfaces of the second and fourth lower select gate electrodes GSL2 and GSL4 may be coplanar with each other as illustrated in FIG. 19. The lower surfaces of the first and third lower select gate electrodes GSL1 and GSL3 may be at a level different from the lower surfaces of the second and fourth lower select gate electrodes GSL2 and GSL4 as illustrated in FIG. 19.

Figure 22:
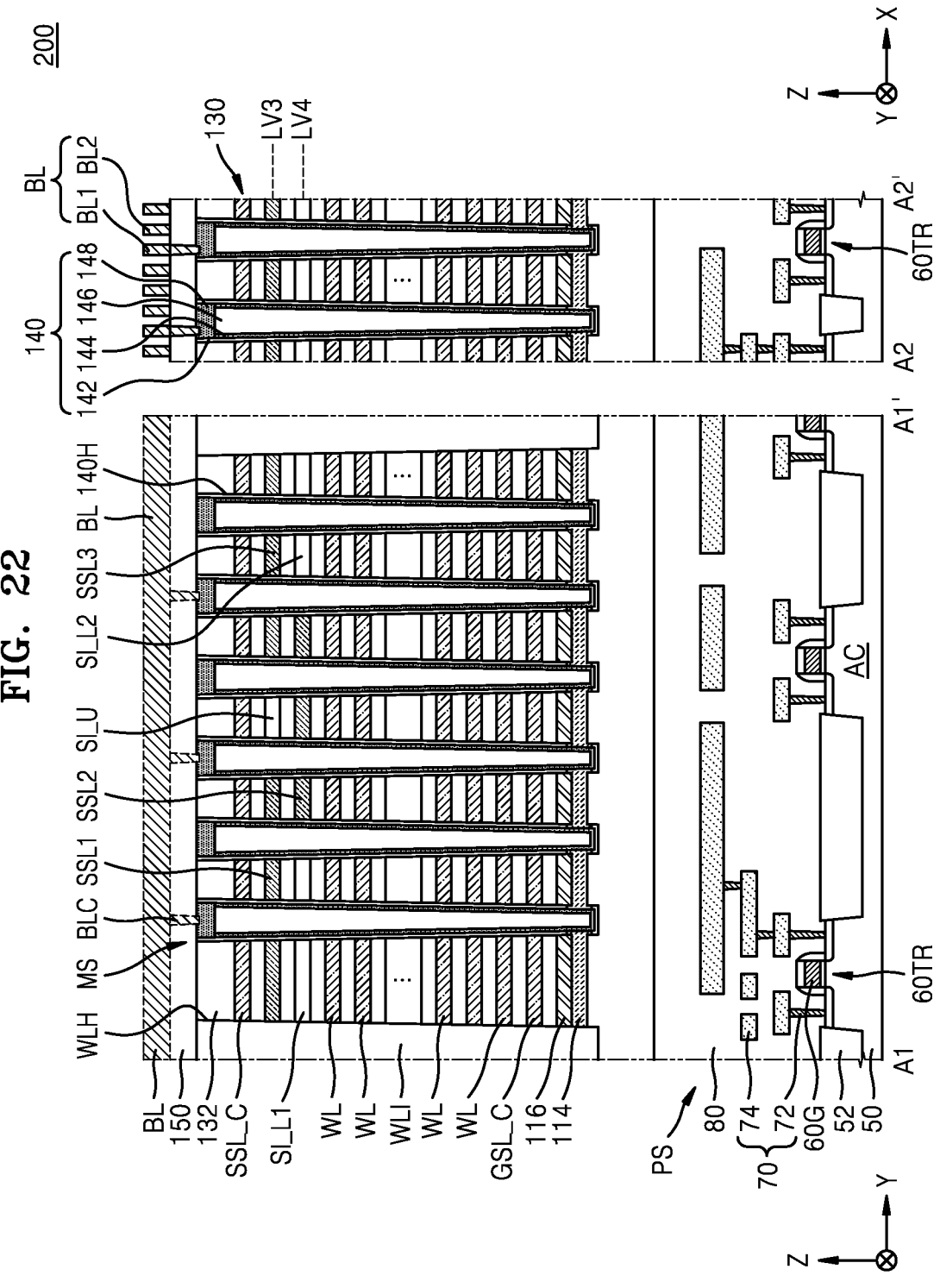
FIG. 22 is a cross-sectional view of a semiconductor device according to example embodiments.
Figure 23:
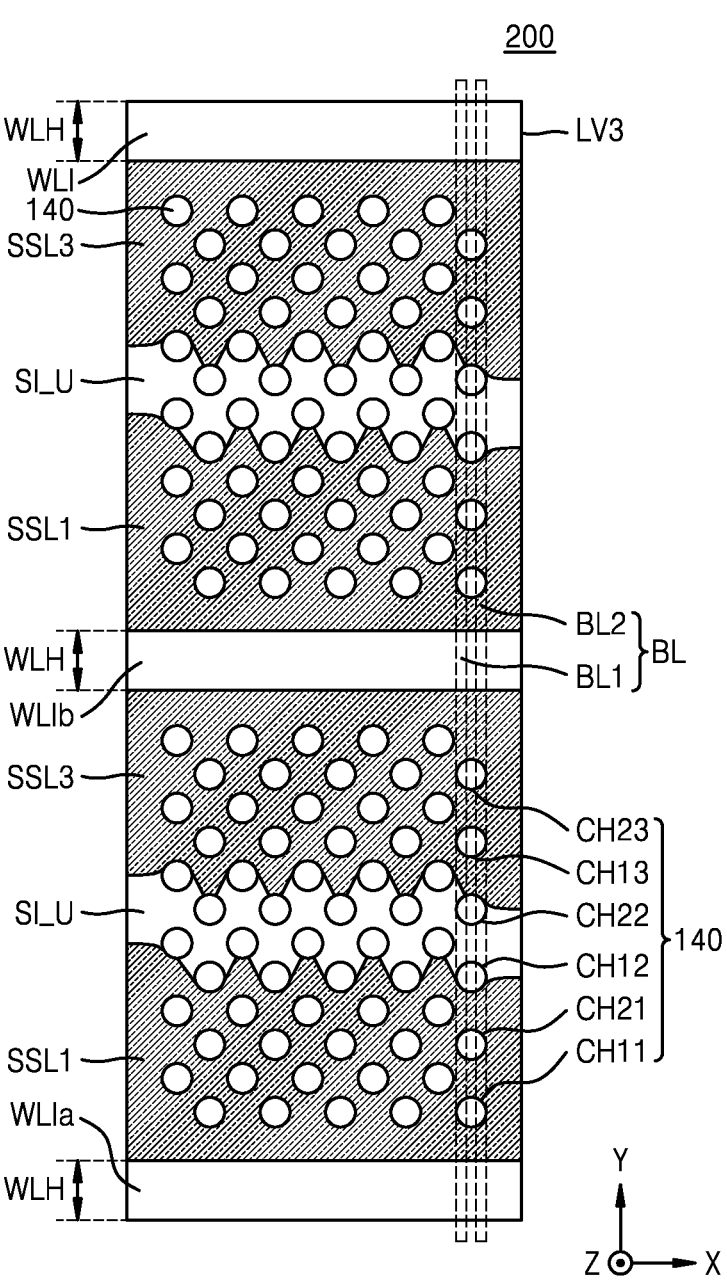
FIG. 23 is a horizontal cross-sectional view at a third vertical level LV3 of FIG. 22 according to example embodiments.
Figure 24:
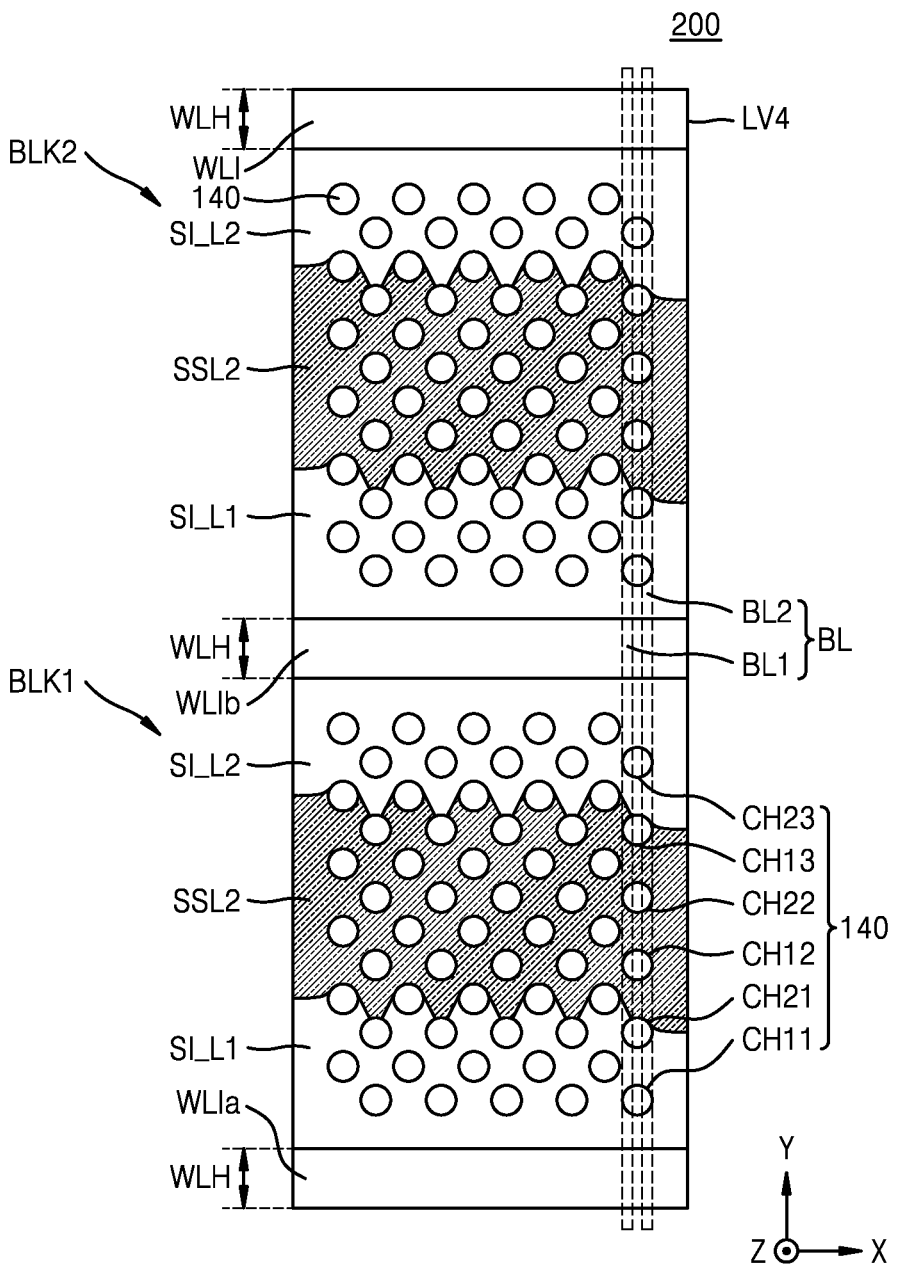
FIG. 24 is a horizontal cross-sectional view at a fourth vertical level LV4 of FIG. 22 according to example embodiments.
Figure 25:
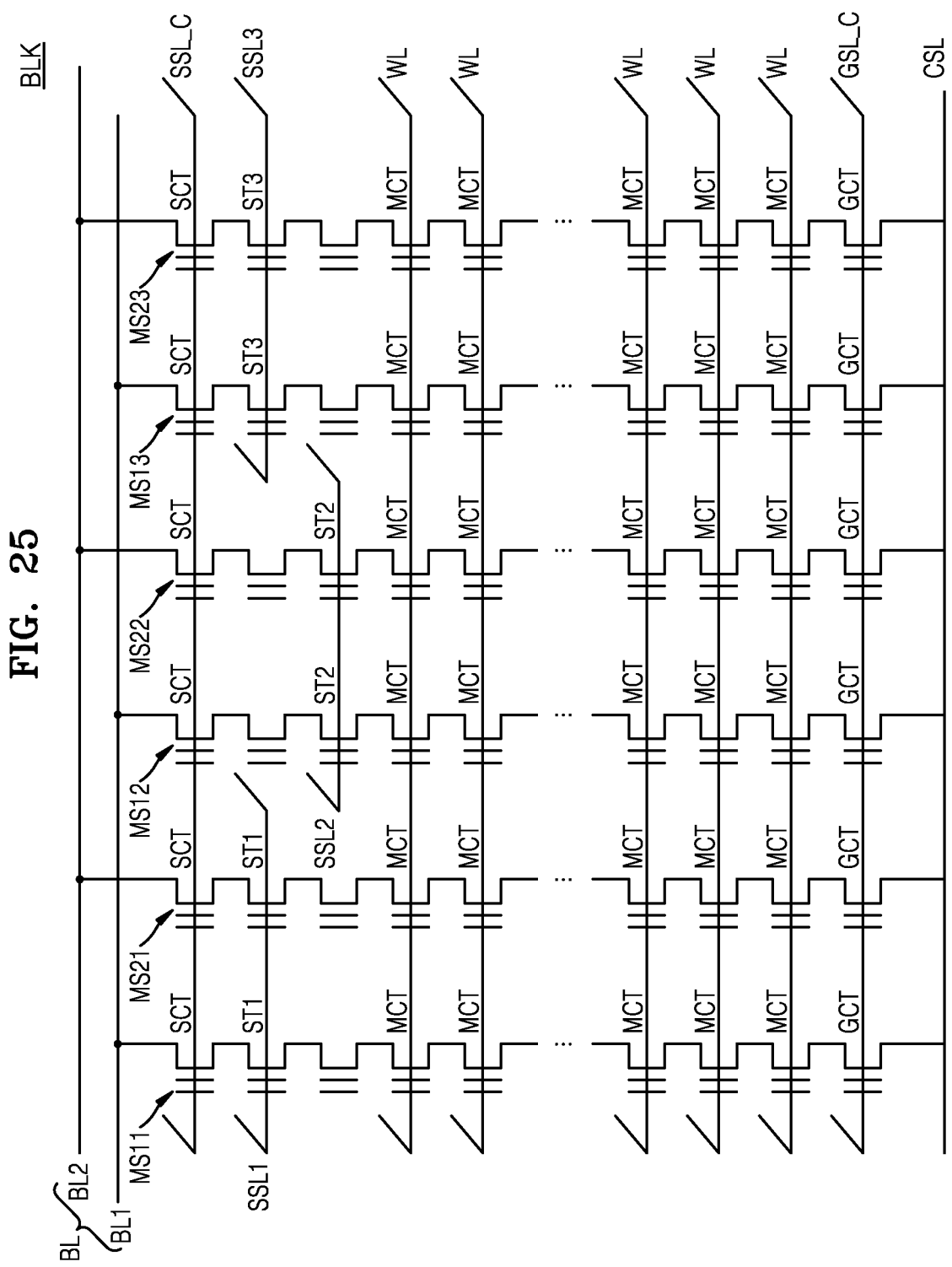
FIG. 25 is an equivalent circuit diagram illustrating a memory cell block of a semiconductor device.

FIG. 22 is a cross-sectional view illustrating a semiconductor device 200 according to example embodiments. FIG. 23 is a horizontal cross-sectional view at the third vertical level LV3 of FIG. 22, and FIG. 24 is a horizontal cross-sectional view at the fourth vertical level LV4 of FIG. 22. FIG. 25 is an equivalent circuit diagram illustrating a memory cell block BLK of the semiconductor device 200.

Referring to FIGS. 22 to 25, the semiconductor device 200 may include a first upper select gate electrode SSL1 and a third upper select gate electrode SSL3 arranged at a third vertical level LV3 and an upper insulating separation layer SI_U arranged therebetween, and may include a second upper select gate electrode SSL2 arranged at a fourth vertical level LV4 lower than the third vertical level LV3, and a first lower insulating separation layer SI_L1 and a second lower insulating separation layer SI_L2 arranged on opposing sides of the second upper select gate electrode SSL2, respectively. In some embodiments, lower surfaces of the first upper select gate electrode SSL1 and the third upper select gate electrode SSL3 may be coplanar with each other, and a lower surface of the second upper select gate electrode SSL2 may be lower than the lower surfaces of the first upper select gate electrode SSL1 and the third upper select gate electrode SSL3 as illustrated in FIG. 22.

A first channel CH11 and a fourth channel CH21 may be surrounded by the first upper select gate electrode SSL1 at the third vertical level LV3, and may be at least partially surrounded by the first lower insulating separation layer SI_L1 at the fourth vertical level LV4. A second channel CH12 and a fifth channel CH22 may be at least partially surrounded by the upper insulating separation layer SI_U at the third vertical level LV3, and may be surrounded by the second upper select gate electrode SSL2 at the fourth vertical level LV4. A third channel CH13 and a sixth channel CH23 may be surrounded by the third upper select gate electrode SSL3 at the third vertical level LV3, and may be at least partially surrounded by the second lower insulating separation layer SI_L2 at the fourth vertical level LV4.

In example embodiments, both sides of the second upper select gate electrode SSL2 may have a wavy shape. The second upper select gate electrode SSL2 may vertically overlap a portion of the first upper select gate electrode SSL1, and the second upper select gate electrode SSL2 may vertically overlap a portion of the third upper select gate electrode SSL3. "An element A vertically overlapping an element B" (or similar language) means that at least one vertical line can be drawn that intersects both elements A and B.

The first upper select transistor ST1 of the first string MS11 configured by the first channel CH11 and the first upper select transistor ST1 of the fourth string MS21 configured by the fourth channel CH21 may share the first upper select gate electrode SSL1. The second upper select transistor ST2 of the second string MS12 configured by the second channel CH12 and the second upper select transistor ST2 of the fifth string MS22 configured by the fifth channel CH22 may share the second upper select gate electrode SSL2. The third upper select transistor ST3 of the third string MS13 configured by the third channel CH13 and the third upper select transistor ST3 of the sixth string MS23 configured by the sixth channel CH23 may share the third upper select gate electrode SSL3. The first to third upper select transistors ST1, ST2, and ST3 may have substantially the same threshold voltage as each other.

In some embodiments, one lower common select gate electrode GSL_C is formed in the semiconductor device 200 and the word line WL is arranged on the lower common select gate electrode GSL_C as illustrated in FIG. 22. In other embodiments, an erase gate electrode (not shown) may be further formed between the lower common select gate electrode GSL_C and the word line WL, the erase gate electrode may surround sidewalls of all six channel structures 140 arranged in a line in the second horizontal direction Y, and opposing sides of the erase gate electrode may contact the first and second stack separation insulating layers WLIa and WLIb, respectively.

According to example embodiments, as the second upper select gate electrode SSL2 is arranged at a different vertical level from the first and third upper select gate electrodes SSL1 and SSL3, misalignment due to a relatively small separation distance between the channel hole and the string separation line cut may be reduced or prevented.

Figure 26:
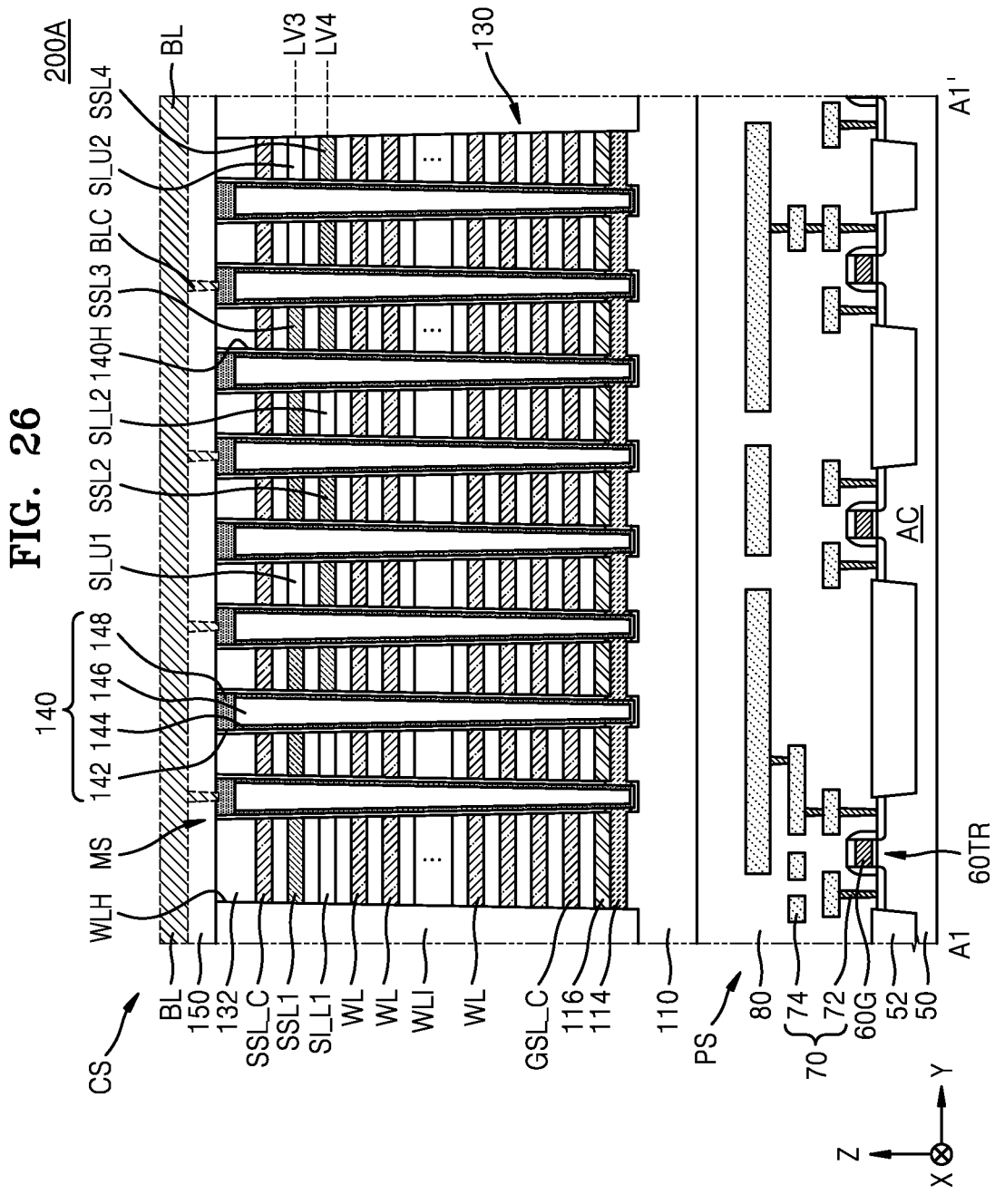
FIG. 26 is a cross-sectional view of a semiconductor device according to example embodiments.
Figure 27:
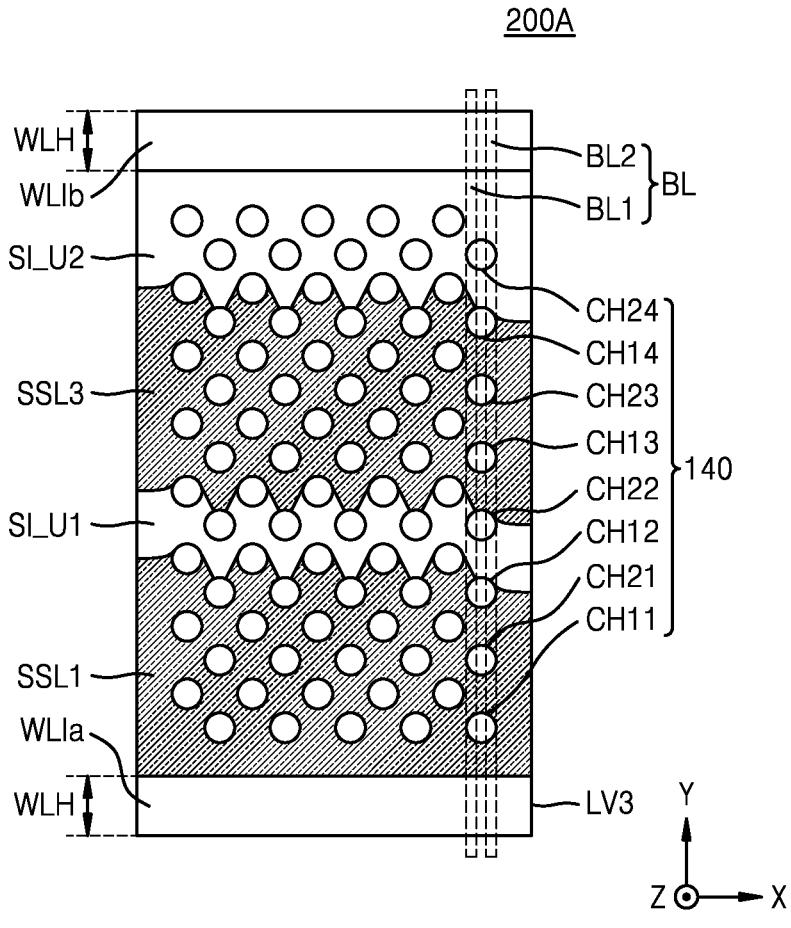
FIG. 27 is a horizontal cross-sectional view at a third vertical level LV3 of FIG. 26 according to example embodiments.
Figure 28:
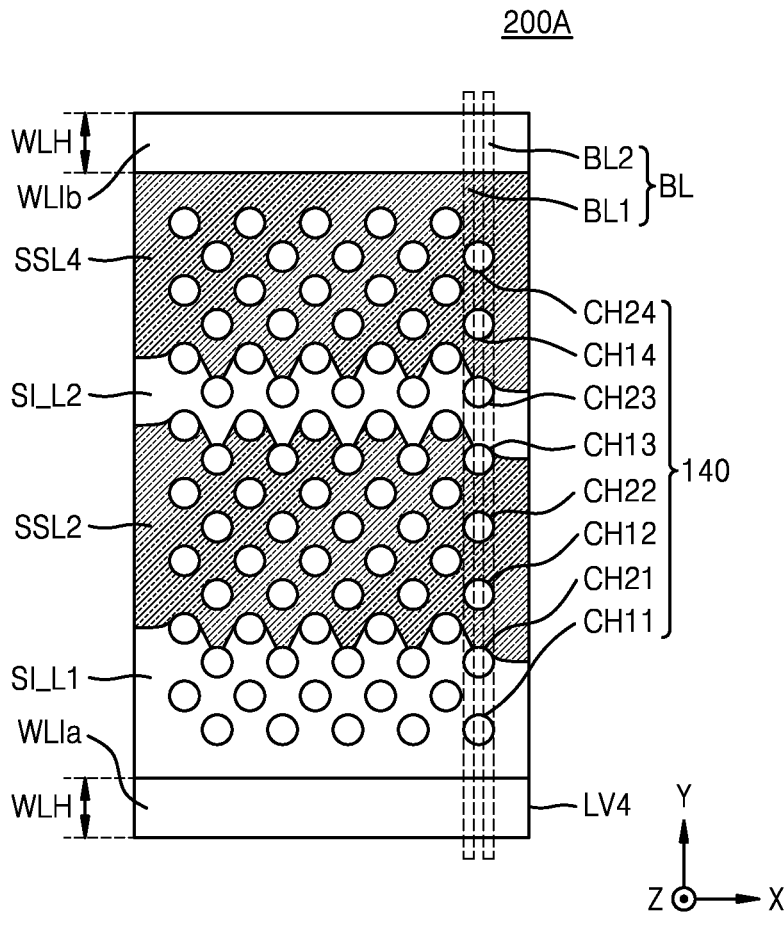
FIG. 28 is a horizontal cross-sectional view at a fourth vertical level LV4 of FIG. 26 according to example embodiments.

FIG. 26 is a cross-sectional view illustrating a semiconductor device 200A according to example embodiments. FIG. 27 is a horizontal cross-sectional view at the third vertical level LV3 of FIG. 26, and FIG. 28 is a horizontal cross-sectional view at the fourth vertical level LV4 of FIG. 26. In FIGS. 26 to 28, the same reference numerals as in FIGS. 1 to 25 indicate the same components.

Referring to FIGS. 26 to 28, one memory cell block BLK may include eight channel structures 140 arranged in a line along the second horizontal direction Y.

At the third vertical level LV3, the third upper select gate electrode SSL3 may be arranged to be spaced apart from the first upper select gate electrode SSL1, and a first upper insulating separation layer SI_U1 may be arranged therebetween. In addition, the third upper select gate electrode SSL3 does not directly contact the second stack separation insulating layer WLIb, and a second upper insulating separation layer SI_U2 may be arranged between the third upper select gate electrode SSL3 and the second stack separation insulating layer WLIb.

At the fourth vertical level LV4, the fourth upper select gate electrode SSL4 may be arranged to be spaced apart from the second upper select gate electrode SSL2, and a second lower insulating separation layer SI_L2 may be arranged therebetween. At the fourth vertical level LV4, the fourth upper select gate electrode SSL4 may surround the seventh channel CH14 and the eighth channel CH24, and at the third vertical level LV3, at least a portion of the seventh channel CH14 and the eighth channel CH24 may be surrounded by the second upper insulating separation layer SI_U2.

According to the semiconductor device 200A according to example embodiments, a block BLK in which eight or more channels are connected may be implemented even if there is no separate string separation insulating layer. In addition, the first and third upper select gate electrodes SSL1 and SSL3 may be arranged at different vertical levels from the second and fourth upper select gate electrodes SSL2 and SSL4, and accordingly, misalignment due to a relatively small separation distance between the channel hole and the common source line cut may be reduced or prevented.

FIGS. 29A to 29F are cross-sectional views illustrating a method of manufacturing the semiconductor device 100 according to example embodiments. FIGS. 29A to 29F are cross-sectional views corresponding to cross sections taken along lines A1-A1' and A2-A2' of FIG. 3.

Figure 29A:
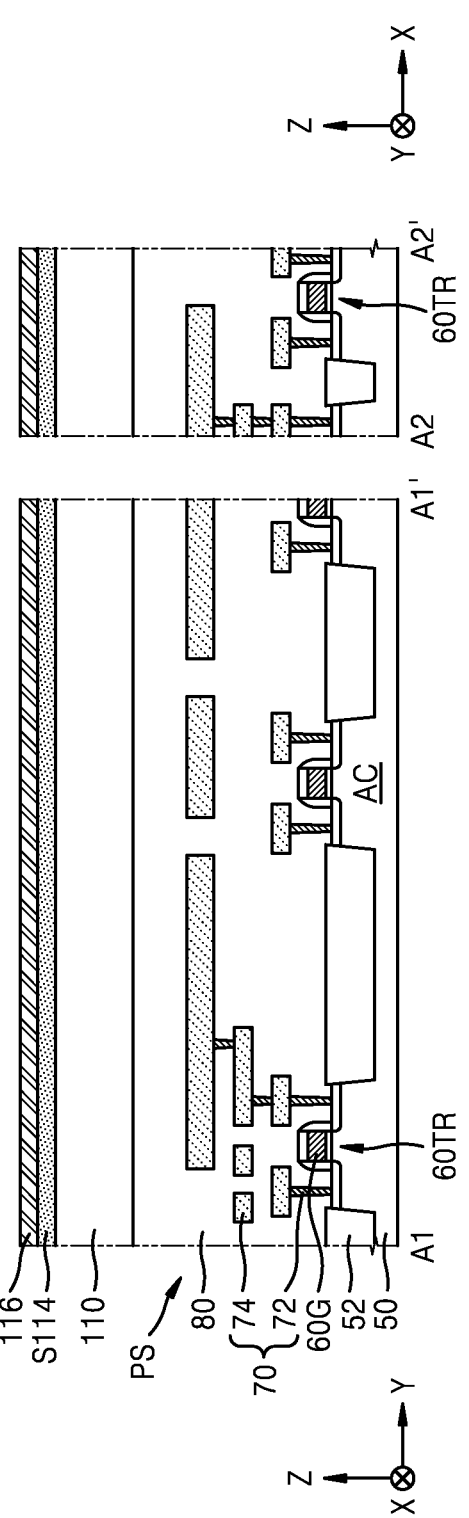
FIGS. 29A to 29F are cross-sectional views illustrating a method of manufacturing a semiconductor device according to example embodiments.

Referring to FIG. 29A, a peripheral circuit structure PS may be formed on a substrate 50. A plurality of peripheral circuit transistors 60TR may be formed on the substrate 50, and the peripheral circuit wiring structure 70 electrically connected to the peripheral circuit transistor 60TR and the interlayer insulating film 80 may be formed.

Thereafter, a common source plate 110 may be formed on the interlayer insulating film 80, and a horizontal sacrificial layer S114 and a support layer 116 may be sequentially formed on the common source plate 110. In some example embodiments, the common source plate 110 may be formed using a semiconductor doped with an n-type impurity.

Figure 29B:
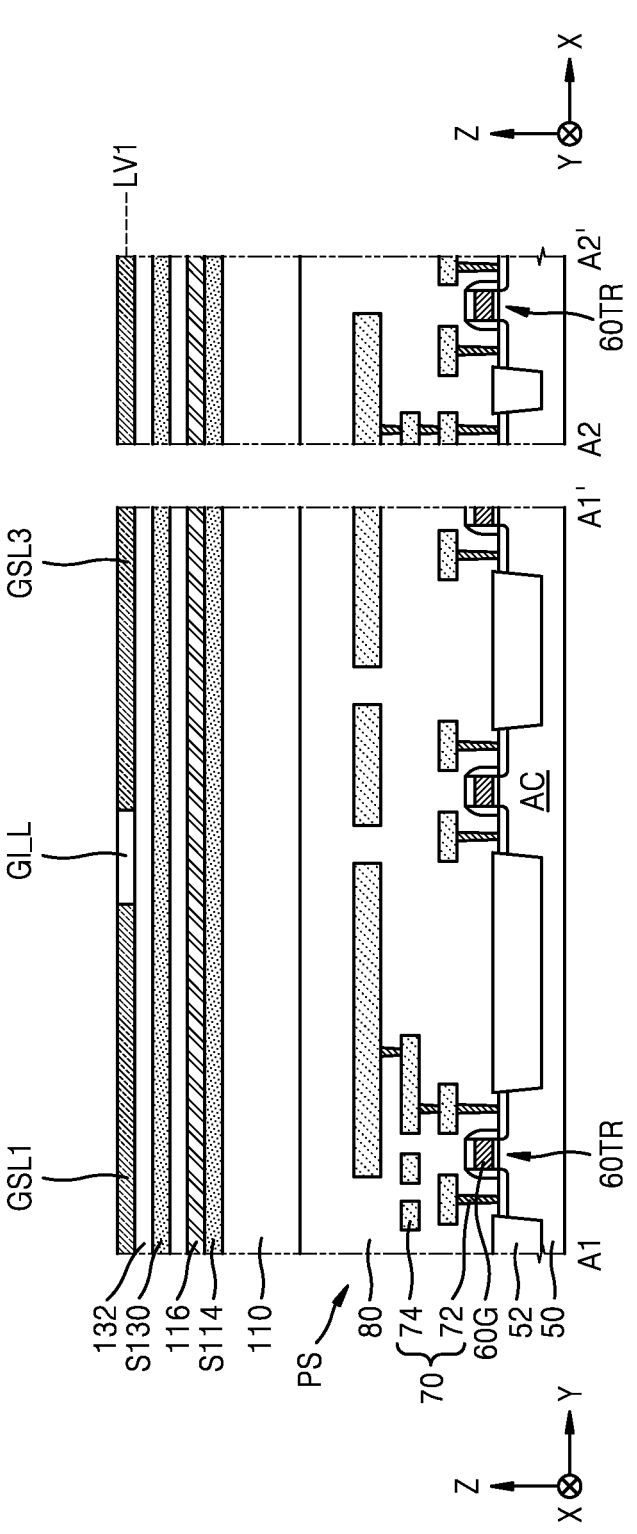

Referring to FIG. 29B, a mold insulating layer 132 and a sacrificial layer S130 may be sequentially formed on the support layer 116. In example embodiments, the mold insulating layer 132 may include an insulating material such as silicon oxide or silicon oxynitride, and the sacrificial layer S130 may include silicon nitride, silicon oxynitride, or polysilicon doped with impurities.

Thereafter, a conductive layer (not shown) is formed on the mold insulating layer 132, a mask pattern is formed on the conductive layer, a portion of the conductive layer is removed, and an insulating material is filled in a space from which the portion of the conductive layer is removed, such that first and third lower select gate electrodes GSL1 and GSL3 spaced apart from each other and a lower insulating separation layer GI_L therebetween may be formed.

In example embodiments, the first and third lower select gate electrodes GSL1 and GSL3 may be formed using doped polysilicon, but the present invention is not limited thereto. In example embodiments, as shown in FIG. 6, both sides of the first lower insulating separation layer GI_L may be formed to have a wavy shape in a plan view.

Figure 29C:
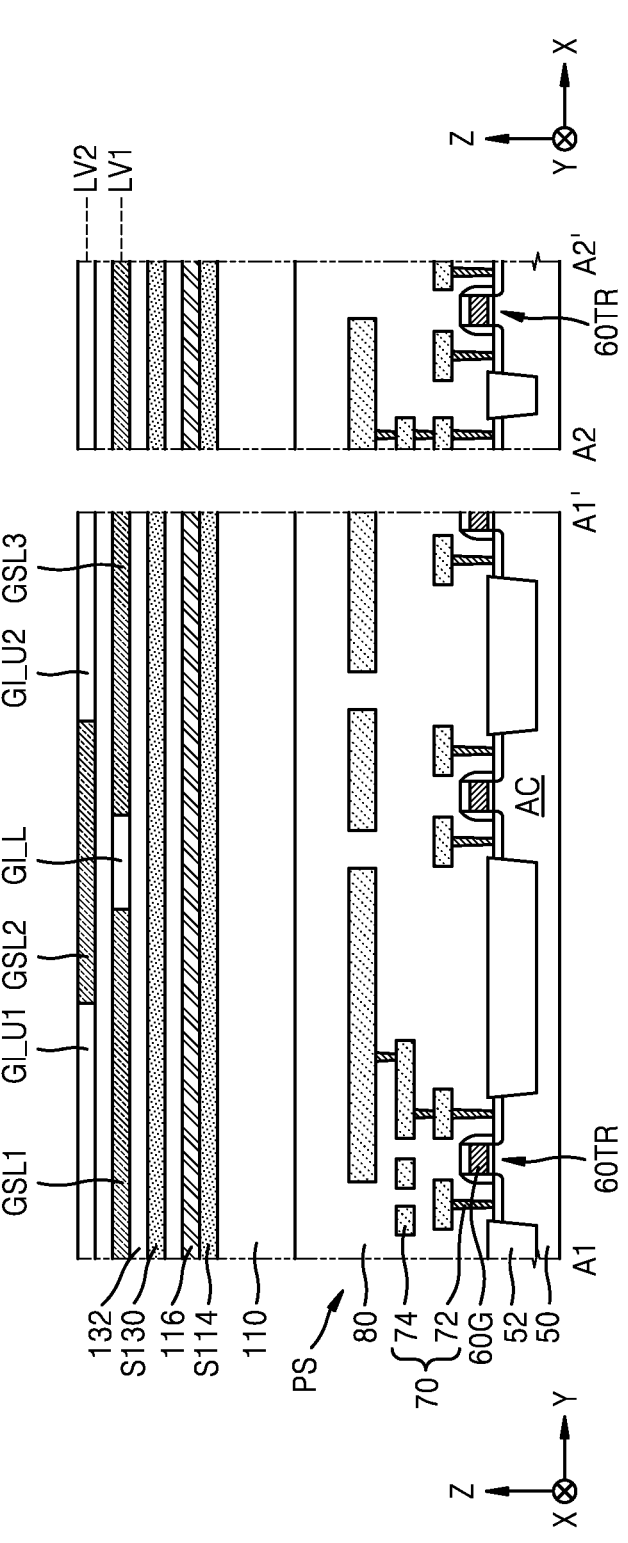

Referring to FIG. 29C, the mold insulating layer 132 may be formed on the first and third lower select gate electrodes GSL1 and GSL3 and the first lower insulating separation layer GI_L. A conductive layer (not shown) is formed on the mold insulating layer 132, a mask pattern is formed on the conductive layer, a portion of the conductive layer is removed, and an insulating material is filled in a space from which the portion of the conductive layer is removed, such that second lower select gate electrode GSL2 and first and second upper insulating separation layers GI_U1 and GI_U2 on respective opposing sides of the second lower select gate electrode GSL2 may be formed.

In example embodiments, as shown in FIG. 7, both sides of the second lower select gate electrode GSL2 may be formed to have a wavy shape in a plan view. Also, the second lower select gate electrode GSL2 may be arranged to vertically overlap with portions of the first and third lower select gate electrodes GSL1 and GSL3.

Figure 29D:
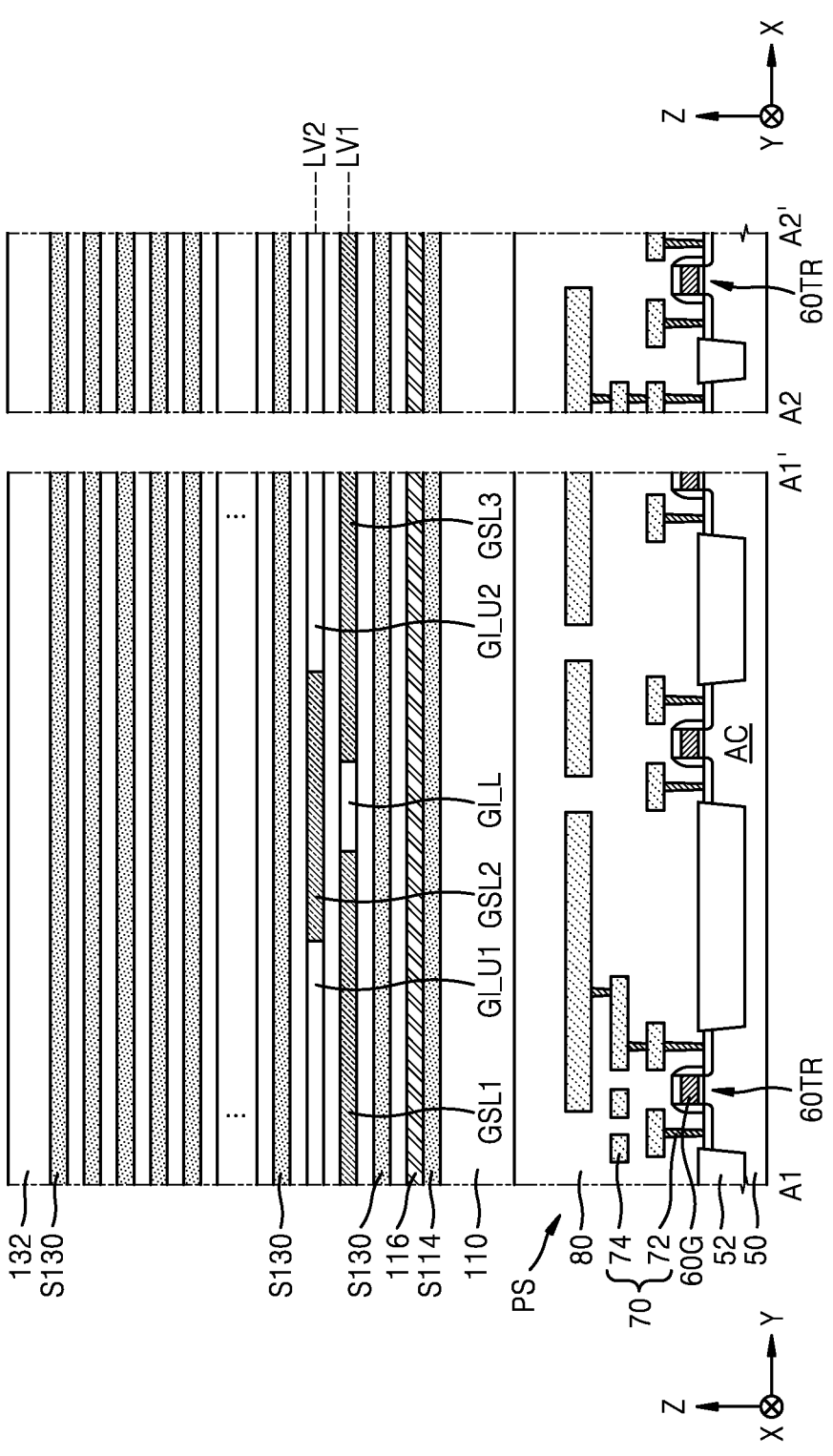

Referring to FIG. 29D, a plurality of mold insulating layers 132 and a plurality of sacrificial layers S130 may be alternately formed on the second lower select gate electrode GSL2 and the first and second upper insulating separation layers GI_U1 and GI_U2.

Figure 29E:
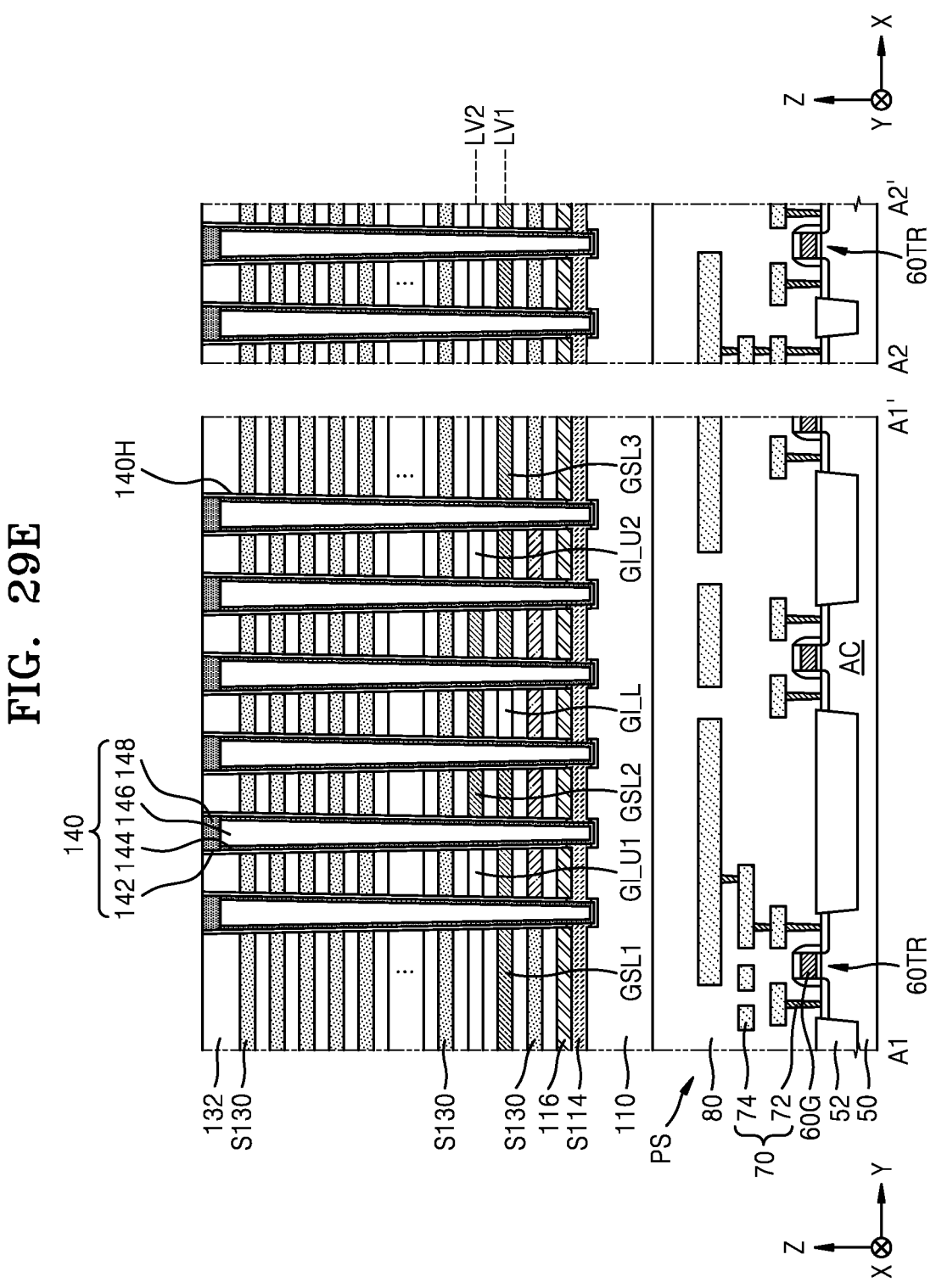

Referring to FIG. 29E, a mask pattern (not shown) may be formed on the uppermost mold insulating layer 132, and channel holes 140H may be formed by patterning the plurality of mold insulating layers 132 and the plurality of sacrificial layers S130 using the mask pattern as an etching mask.

Thereafter, the channel structure 140 including the gate insulating layer 142, the channel layer 144, the buried insulating layer 146, and the conductive plug 148 may be formed on the inner wall of the channel hole 140H.

Figure 29F:
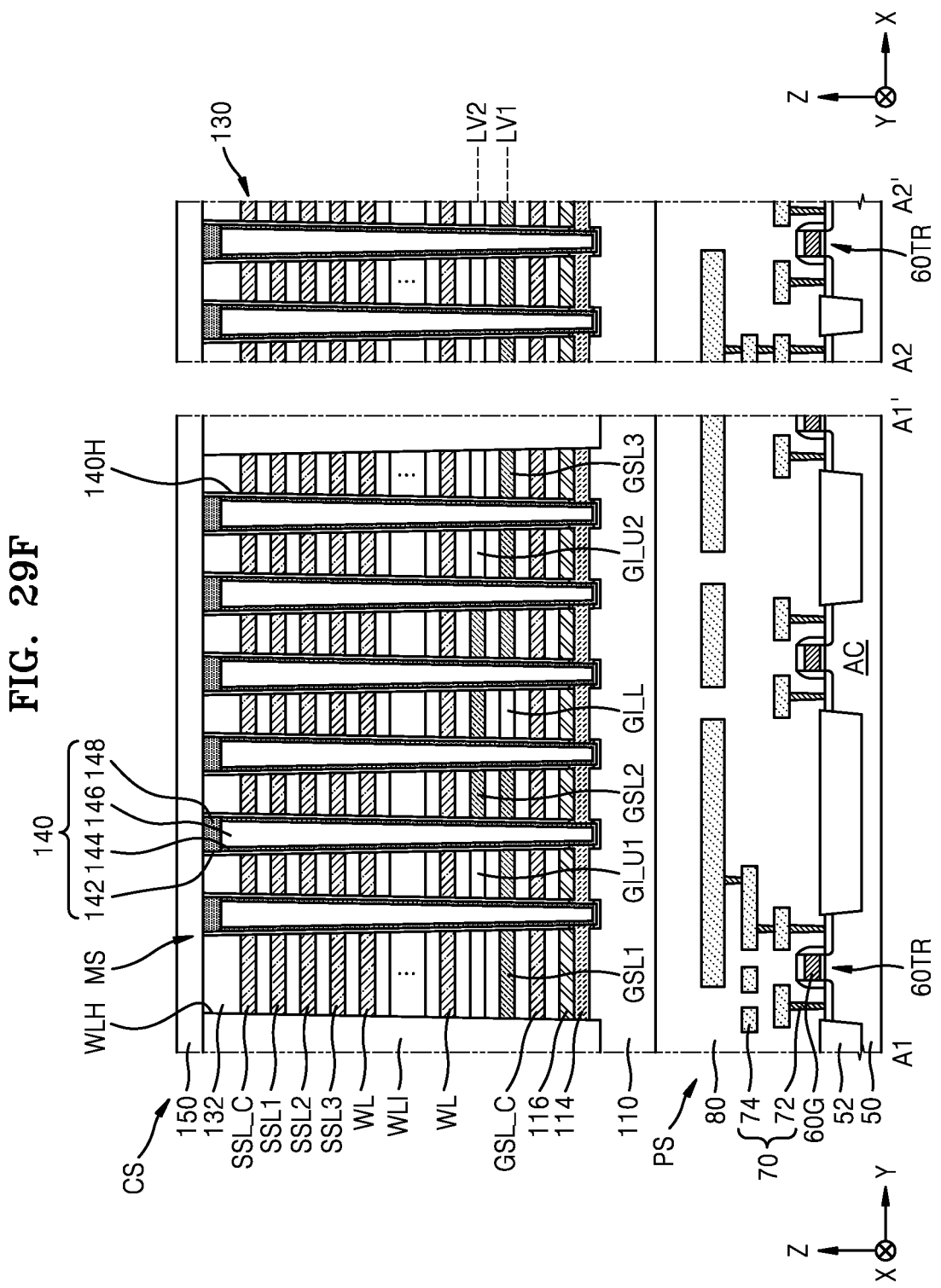

Referring to FIG. 29F, the upper insulating layer 150 may be formed on the uppermost mold insulating layer 132. A mask pattern (not shown) may be formed on the upper insulating layer 150, and a gate stack separation opening WLH may be formed by removing portions of the plurality of mold insulating layers 132 and the plurality of sacrificial layers S130 using the mask pattern as an etching mask.

Thereafter, the horizontal sacrificial layer S114 exposed on the sidewall of the bottom of the gate stack separation opening WLH is removed, and polysilicon is filled in the portion where the horizontal sacrificial layer S114 is removed to form the horizontal semiconductor layer 114.

Thereafter, the plurality of sacrificial layers S130 exposed on the sidewall of the gate stack separation opening WLH is removed, and a conductive material is filled in the portion where the sacrificial layer S130 is removed to form the plurality of gate electrodes 130.

Thereafter, a stack separation insulating layer WLI may be formed using an insulating material inside the gate stack separation opening WLH.

The semiconductor device 100 may be completed by performing the above-described processes.

When the first to third lower select gate electrodes are arranged at the same vertical level as each other, an electrical separation region between the first lower select gate electrode and the second lower select gate electrode is formed to have a relatively small width. In particular, since the channel structures 140 having a small size are arranged in a zigzag shape, the electrical separation region may be formed in a wavy shape having a narrow width in a plan view. In particular, since the channel hole having a high aspect ratio is formed to pass through the mold stack after the electrical separation region is formed first, in the channel hole-forming process, there is a problem in that channel hole misalignment occurs due to a leak of a mold stack or an alignment error of a mask pattern.

On the other hand, according to example embodiments, the first and third lower select gate electrodes GSL1 and GSL3 and the second lower select gate electrode GSL2 may be arranged at different vertical levels, and therefore, even if lining of the mold stack or alignment error of the mask pattern occurs, misalignment of channel holes may be prevented.

Figure 30:
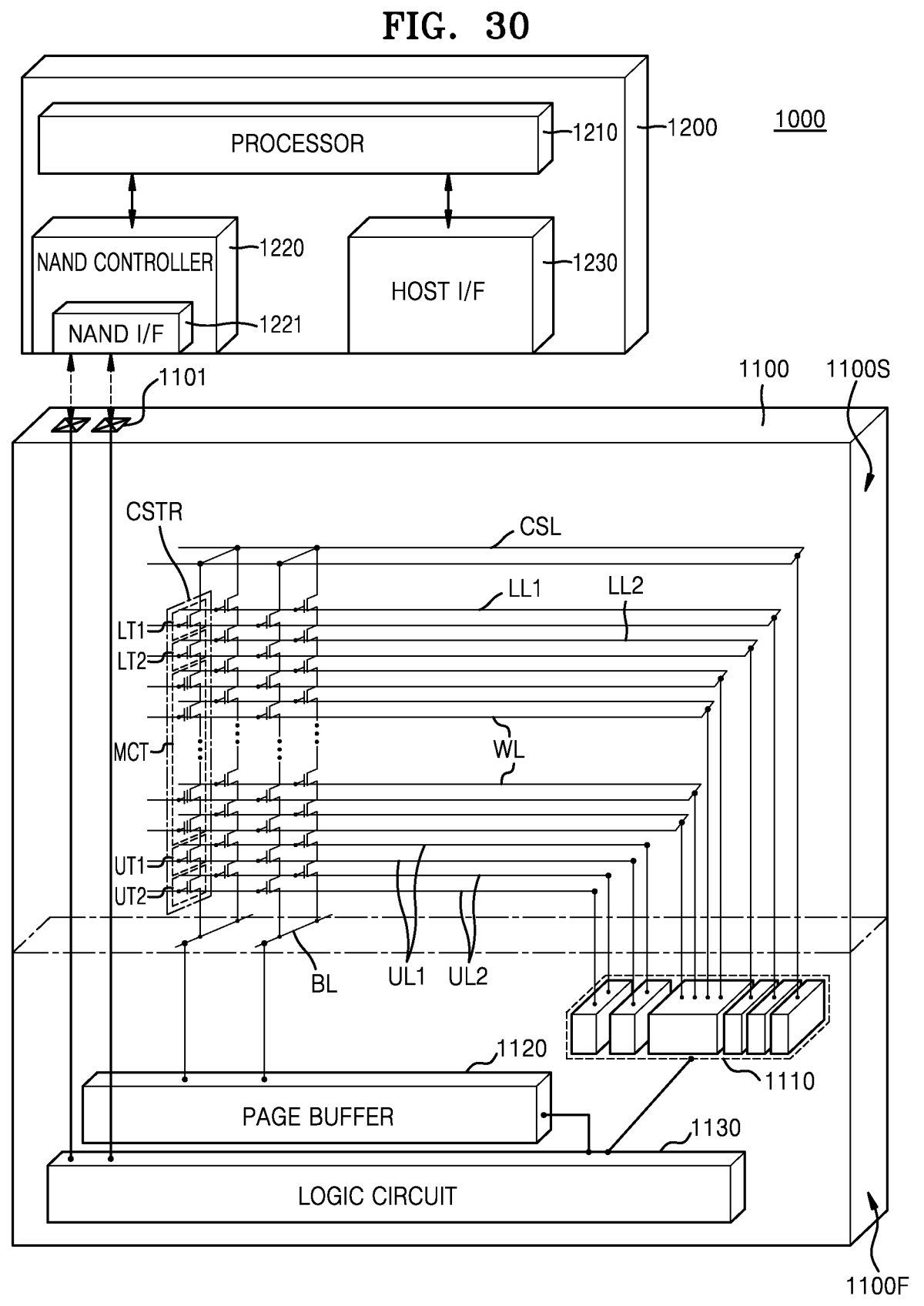

FIG. 30 is a diagram schematically illustrating a data storage system 1000 including a semiconductor device according to example embodiments.

Referring to FIG. 30, the data storage system 1000 may include one or more semiconductor devices 1100 and a memory controller 1200 electrically connected to the semiconductor device 1100. The data storage system 1000 may be, for example, a solid state drive (SSD) device including at least one semiconductor device 1100, a universal serial bus (USB), a computing system, a medical device, or a communication device.

The semiconductor device 1100 may be a non-volatile semiconductor device, and for example, the semiconductor device 1100 may be a NAND flash semiconductor device including one of the semiconductor devices 10, 100, 100A, 100B, 100C 200, and 200A described with reference to FIGS. 1 to 28. The semiconductor device 1100 may include a first structure 1100F and a second structure 1100S on the first structure 1100F. The first structure 1100F may be a peripheral circuit structure including a row decoder 1110, a page buffer 1120, and a logic circuit 1130.

The second structure 1100S may be a memory cell structure including a bit line BL, a common source line CSL, a plurality of word lines WL, first and second string select lines UL1 and UL2, first and second ground select lines LL1 and LL2, and a plurality of memory cell strings CSTR between the bit line BL and the common source line CSL.

In the second structure 1100S, each of the plurality of memory cell strings CSTR may include ground select transistors LT1 and LT2 adjacent to the common source line CSL, string select transistors UT1 and UT2 adjacent to the bit line BL, and a plurality of memory cell transistors MCT arranged between the ground select transistors LT1 and LT2 and the string select transistors UT1 and UT2. The number of ground select transistors LT1 and LT2 and the number of string select transistors UT1 and UT2 may be variously modified according to embodiments.

In example embodiments, the plurality of ground select lines LL1 and LL2 may be connected to gate electrodes of the ground select transistors LT1 and LT2, respectively. The word line WL may be connected to a gate electrode of the memory cell transistor MCT. The plurality of string select lines UL1 and UL2 may be respectively connected to gate electrodes of the string select transistors UT1 and UT2.

The common source line CSL, the plurality of ground select lines LL1 and LL2, the plurality of word lines WL, and the plurality of string select lines UL1 and UL2 may be connected to the row decoder 1110. The plurality of bit lines BL may be electrically connected to the page buffer 1120.

The semiconductor device 1100 may communicate with the memory controller 1200 through the input/output pad 1101 electrically connected to the logic circuit 1130. The input/output pad 1101 may be electrically connected to the logic circuit 1130.

The memory controller 1200 may include a processor 1210, a NAND controller 1220, and a host interface 1230. In some embodiments, the data storage system 1000 may include a plurality of semiconductor devices 1100, and in this case, the memory controller 1200 may control the plurality of semiconductor devices 1100.

The processor 1210 may control the overall operation of the data storage system 1000 including the memory controller 1200. The processor 1210 may operate according to a preset firmware, and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written to the plurality of memory cell transistors MCT of the semiconductor device 1100, and data to be read from the plurality of memory cell transistors MCT of the semiconductor device 1100 may be transmitted. The host interface 1230 may provide a communication function between the data storage system 1000 and an external host. When receiving a control command from an external host through the host interface 1230, the processor 1210 may control the semiconductor device 1100 in response to the control command.

Figure 31:
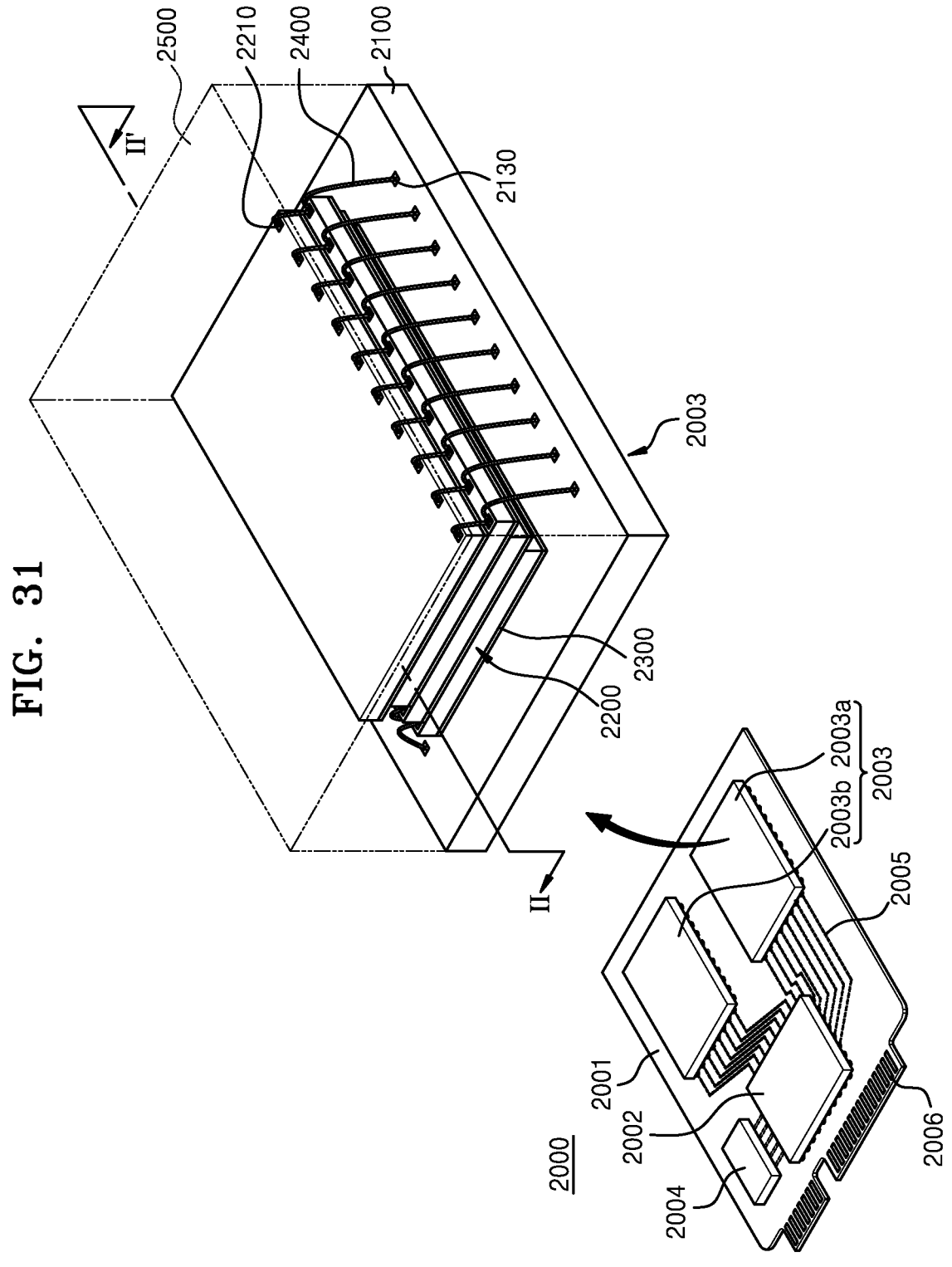
FIG. 31 is a cross-sectional view schematically illustrating semiconductor packages according to example embodiments.

FIG. 31 is a perspective view schematically illustrating a data storage system 2000 including a semiconductor device according to example embodiments.

Referring to FIG. 31, a data storage system 2000 according to an example embodiment may include a main board 2001, a memory controller 2002 mounted on the main board 2001, one or more semiconductor packages 2003, and a DRAM 2004. The semiconductor package 2003 and the DRAM 2004 may be connected to the memory controller 2002 by a plurality of wiring patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In example embodiments, the data storage system 2000 may communicate with an external host according to any one of the interfaces such as Universal Serial Bus (USB), Peripheral Component Interconnect Express (PCI-Express), Serial Advanced Technology Attachment (SATA), and M-Phy for Universal Flash Storage (UFS). In example embodiments, the data storage system 2000 may operate by power supplied from an external host through the connector 2006. The data storage system 2000 may further include a power management integrated circuit (PMIC) for distributing power supplied from the external host to the memory controller 2002 and the semiconductor package 2003.

The memory controller 2002 may write data to or read data from the semiconductor package 2003, and may improve the operating speed of the data storage system 2000.

The DRAM 2004 may be a buffer memory for reducing a speed difference between the semiconductor package 2003, that is, a data storage space, and an external host. The DRAM 2004 included in the data storage system 2000 may operate as a kind of cache memory, and may provide a space for temporarily storing data in a control operation for the semiconductor package 2003.

When the data storage system 2000 includes the DRAM 2004, the memory controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, a plurality of semiconductor chips 2200 on the package substrate 2100, an adhesive layer 2300 arranged on a lower surface of each of the plurality of semiconductor chips 2200, a connection structure 2400 electrically connecting the plurality of semiconductor chips 2200 and the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 30. Each of the plurality of semiconductor chips 2200 may include at least one of the semiconductor devices 10, 100, 100A, 100B, 100C, 200, and 200A described with reference to FIGS. 1 to 28.

In example embodiments, the connection structure 2400 may be a bonding wire electrically connecting the input/output pad 2210 and the package upper pad 2130. Accordingly, in the first and second semiconductor packages 2003*a* and 2003*b*, the plurality of semiconductor chips 2200 may be electrically connected to each other by a bonding wire method, and may be electrically connected to the package upper pad 2130 of the package substrate 2100. In example embodiments, in relation to the first and second semiconductor packages 2003*a* and 2003*b*, the plurality of semiconductor chips 2200 may be electrically connected to each other by a connection structure including a through silicon via (TSV) instead of the bonding wire type connection structure 2400.

In example embodiments, the memory controller 2002 and the plurality of semiconductor chips 2200 may be included in one package. In an example embodiment, the memory controller 2002 and the plurality of semiconductor chips 2200 are mounted on a separate interposer board different from the main board 2001, and the memory controller 2002 and the plurality of semiconductor chips 2200 may be connected to each other by wiring formed on the interposer substrate.

Figure 32:
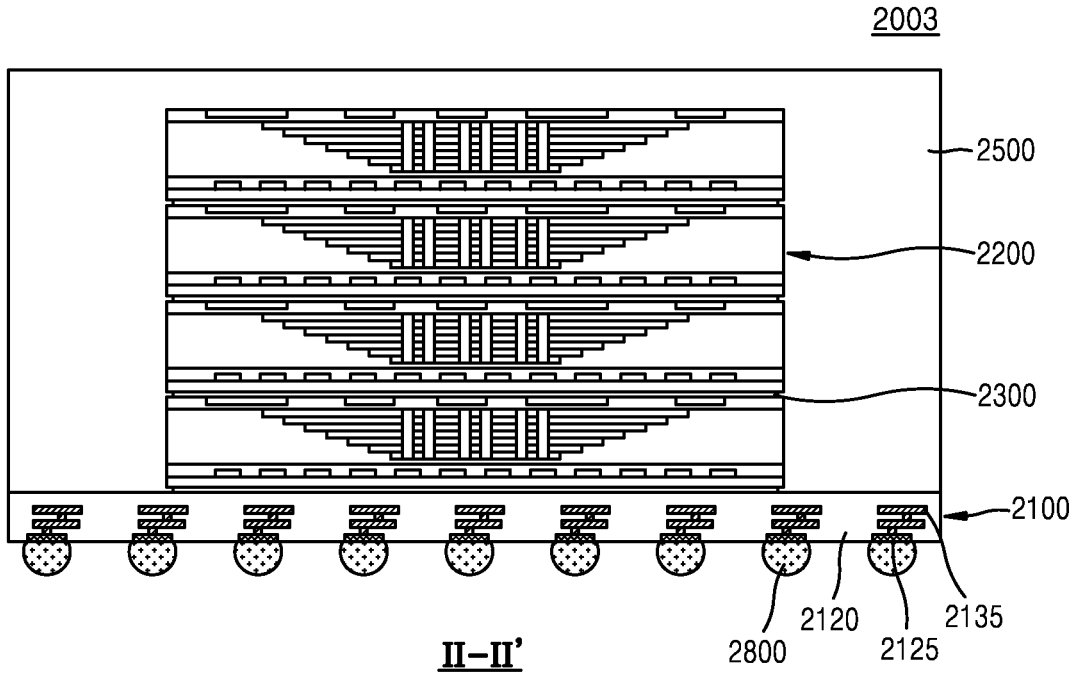
FIG. 32 is a cross-sectional view schematically illustrating semiconductor packages according to example embodiments.

FIG. 32 is a cross-sectional view schematically illustrating semiconductor packages 2003 according to example embodiments. FIG. 32 is a cross-sectional view taken along line II-II' of FIG. 31.

Referring to FIG. 32, in the semiconductor package 2003, the package substrate 2100 may be a printed circuit board. The package substrate 2100 may include a package substrate body part 2120, a plurality of package upper pads 2130

(refer to FIG. 31) arranged on the upper surface of the package substrate body part 2120; a plurality of lower pads 2125 arranged on or exposed through the lower surface of the package substrate body 2120, and a plurality of internal wirings 2135 that electrically connect the plurality of package upper pads 2130 (refer to FIG. 31) and the plurality of lower pads 2125 in the package substrate body part 2120. As shown in FIG. 32, the plurality of package upper pads 2130 may be electrically connected to the plurality of connection structures 2400. As shown in FIG. 32, the plurality of lower pads 2125 may be connected to the plurality of wiring patterns 2005 on the main board 2001 of the data storage system 2000 shown in FIG. 31 through the plurality of conductive bumps 2800. Each of the plurality of semiconductor chips 2200 may include at least one of the semiconductor devices 10, 100, 100A, 100B, 100C, 200, and 200A described with reference to FIGS. 1 to 28.

As used herein, an element or region that is "covering" or "surrounding" or "filling" another element or region may completely or partially cover or surround or fill the other element or region. Further, the term "and/or" includes any and all combinations of one or more of the associated listed items.

While the inventive concept has been particularly shown and described with reference to embodiments thereof, it will be understood that various changes in form and details may be made therein without departing from the scope of the following claims.

What is claimed is:

1. A semiconductor device comprising:
   a peripheral circuit structure;
   a memory cell block on the peripheral circuit structure and including a plurality of strings, each of the plurality of strings including a lower select transistor, memory cell transistors, an upper select transistor, and a lower insulating separation layer, and the lower select transistor, the memory cell transistors and the upper select transistor being connected in series and stacked in a vertical direction; and
   a plurality of bit lines on the memory cell block, the plurality of bit lines including a first bit line electrically connected to a first string, a second string, and a third string among the plurality of strings,
   wherein the lower select transistor of the first string comprises a first lower select gate electrode,
   wherein the lower select transistor of the second string comprises a second lower select gate electrode that comprises a lower surface at a different vertical level from a lower surface of the first lower select gate electrode and is electrically isolated from the first lower select gate electrode,
   wherein the lower select transistor of the third string comprises a third lower select gate electrode that comprises a lower surface at the same vertical level as the lower surface of the first lower select gate electrode and is electrically isolated from the first and second lower select gate electrodes, and
   wherein the lower insulating separation layer is between and coplanar with the first lower select gate electrode and the third lower select gate electrode.

2. The semiconductor device of claim 1, wherein the upper select transistor comprises:
   a first upper select transistor;
   a second upper select transistor between the first upper select transistor and the memory cell transistors; and
   a third upper select transistor between the second upper select transistor and the memory cell transistors, wherein the semiconductor device further comprises an upper select gate electrode that is a common gate electrode of the first upper select transistor of the first string, the first upper select transistor of the second string, and the first upper select transistor of the third string.

3. The semiconductor device of claim 2, wherein the first upper select transistor of the first string, the second upper select transistor of the second string, and the third upper select transistor of the third string have a first threshold voltage, wherein the first upper select transistors of the second and third strings, the second upper select transistors of the first and third strings, and the third upper select transistors of the first and second strings have a second threshold voltage, and wherein the second threshold voltage is greater than the first threshold voltage.

4. The semiconductor device of claim 3, wherein the first threshold voltage has a negative value, and wherein the second threshold voltage has a positive value.

5. The semiconductor device of claim 1, further comprising:

first and second stack separation insulating layers on opposing sides of the memory cell block on the peripheral circuit structure, respectively, and extending in a first horizontal direction; and a first upper insulating separation layer and a second upper insulating separation layer on opposing sides of the second lower select gate electrode, wherein the first upper insulating separation layer is in contact with the first stack separation insulating layer, and wherein the second upper insulating separation layer is in contact with the second stack separation insulating layer.

6. The semiconductor device of claim 5, wherein the plurality of strings further comprise:

a fourth string between the first string and the second string;

a fifth string between the second string and the third string; and a sixth string between the third string and the second stack separation insulating layer, wherein the plurality of bit lines further comprise a second bit line that is adjacent to the first bit line and is electrically connected to the fourth, fifth and sixth strings.

7. The semiconductor device of claim 6, wherein the first lower select gate electrode is a common gate electrode of the lower select transistor of the fourth string and the lower select transistor of the first string, wherein the second lower select gate electrode is a common gate electrode of the lower select transistor of the fifth string and the lower select transistor of the second string, and wherein the third lower select gate electrode is a common gate electrode of the lower select transistor of the sixth string and the lower select transistor of the third string.

8. The semiconductor device of claim 1, wherein each of the plurality of strings further comprises:

a lower common select transistor that is between the memory cell transistors and the peripheral circuit structure and is connected in series with the lower select transistor; and an upper common select transistor that is between the memory cell transistors and the plurality of bit lines and is connected in series with the upper select transistor.

9. The semiconductor device of claim 1, wherein the plurality of strings further comprise a seventh string adjacent to the third string and electrically connected to the first bit line, and wherein the lower select transistor of the seventh string comprises a fourth lower select gate electrode that comprises a lower surface at the same vertical level as the lower surface of the second lower select gate electrode and is electrically isolated from the first to third lower select gate electrodes.

10. The semiconductor device of claim 9, further comprising an upper insulating separation layer that is between the second lower select gate electrode and the fourth lower select gate electrode and comprises an upper surface coplanar with upper surfaces of the second and fourth lower select gate electrodes.

11. A semiconductor device comprising:

a peripheral circuit structure;

a plurality of gate electrodes spaced apart from each other in a vertical direction on the peripheral circuit structure;

first and second stack separation insulating layers on opposing sides of the plurality of gate electrodes, respectively, and extending in a first horizontal direction;

a plurality of channel structures extending in the vertical direction through the plurality of gate electrodes; and a plurality of bit lines on the plurality of gate electrodes, wherein the plurality of channel structures comprise a first channel structure, a second channel structure, and a third channel structure electrically connected to a first bit line among the plurality of bit lines, wherein the plurality of gate electrodes comprise:

a first lower select gate electrode surrounding a first lower portion of a sidewall of the first channel structure;

a second lower select gate electrode surrounding a first lower portion of a sidewall of the second channel structure and comprising a lower surface at a vertical level higher than a lower surface of the first lower select gate electrode;

a third lower select gate electrode surrounding a first lower portion of a sidewall of the third channel structure and comprising a lower surface at the same vertical level as the lower surface of the first lower select gate electrode;

a plurality of word lines on the first to third lower select gate electrodes, each of the plurality of word lines surrounding middle portions of the sidewalls of the first to third channel structures; and upper select gate electrodes surrounding upper portions of the sidewalls of the first to third channel structures on the plurality of word lines, and wherein the semiconductor device comprises a lower insulating separation layer between and coplanar with the first lower select gate electrode and the third lower select gate electrode.

12. The semiconductor device of claim 11, further comprising:

a first upper insulating separation layer on a first side of the second lower select gate electrode and surrounding a second lower portion of the sidewall of the first channel structure; and a second upper insulating separation layer on a second side of the second lower select gate electrode and surrounding a second lower portion of the sidewall of the third channel structure, wherein the lower insulating separation layer surrounds a second lower portion of the sidewall of the second channel structure.

13. The semiconductor device of claim 12, wherein an upper surface of the second lower select gate electrode is coplanar with upper surfaces of the first and second upper insulating separation layers, and wherein upper surfaces of the first and third lower select gate electrodes are coplanar with an upper surface of the lower insulating separation layer.

14. The semiconductor device of claim 12, wherein the first lower select gate electrode vertically overlaps with a portion of the first upper insulating separation layer and a first portion of the second lower select gate electrode, and wherein the third lower select gate electrode vertically overlaps with a portion of the second upper insulating separation layer and a second portion of the second lower select gate electrode.

15. The semiconductor device of claim 12, wherein, in a plan view, the first and second sides of the second lower select gate electrode have a wavy shape.

16. The semiconductor device of claim 12, wherein the plurality of channel structures further comprise:

a fourth channel structure between the first channel structure and the second channel structure;

a fifth channel structure between the second channel structure and the third channel structure; and a sixth channel structure between the third channel structure and the second stack separation insulating layer, wherein the bit lines further comprise a second bit line that is adjacent to the first bit line and is electrically connected to the fourth to sixth channel structures.

17. The semiconductor device of claim 16, wherein the first lower select gate electrode surrounds a lower portion of a sidewall of the fourth channel structure, wherein the second lower select gate electrode surrounds a lower portion of a sidewall of the fifth channel structure, and wherein the third lower select gate electrode surrounds a lower portion of a sidewall of the sixth channel structure.

18. The semiconductor device of claim 16, wherein the upper select gate electrodes comprise:

a first upper select gate electrode surrounding first upper portions of sidewalls of the first to third channel structures;

a second upper select gate electrode that is below the first upper select gate electrode and surrounds second upper portions of the sidewalls of the first to third channel structures; and a third upper select gate electrode that is below the second upper select gate electrode and surrounds third upper portions of the sidewalls of the first to third channel structures.

19. The semiconductor device of claim 18, wherein first sides of the first to third upper select gate electrodes are in contact with the first stack separation insulating layer, and wherein second sides of the first to third upper select gate electrodes are in contact with the second stack separation insulating layer.

20. An electronic system comprising:

a main board;

a semiconductor device on the main board; and a controller electrically connected to the semiconductor device on the main board, wherein the semiconductor device comprises:

a peripheral circuit structure;

a memory cell block on the peripheral circuit structure and including a plurality of strings, each of the plurality of strings including a lower select transistor, memory cell transistors, an upper select transistor, and a lower insulating separation layer, and the lower select transistor, the memory cell transistors and the upper select transistor being connected in series and stacked in a vertical direction; and a plurality of bit lines on the memory cell block, the plurality of bit lines including a first bit line electrically connected to a first string, a second string, and a third string among the plurality of strings, wherein the lower select transistor of the first string comprises a first lower select gate electrode, wherein the lower select transistor of the second string comprises a second lower select gate electrode that comprises a lower surface at a different vertical level from a lower surface of the first lower select gate electrode and is electrically isolated from the first lower select gate electrode, wherein the lower select transistor of the third string comprises a third lower select gate electrode that comprises a lower surface at the same vertical level as the lower surface of the first lower select gate electrode and is electrically isolated from the first and second lower select gate electrodes, and wherein the lower insulating separation layer is between and coplanar with the first lower select gate electrode and the third lower select gate electrode.

* * * * *